(12) United States Patent
Ikehata

(10) Patent No.: US 8,118,530 B2
(45) Date of Patent: Feb. 21, 2012

(54) SUBSTRATE STORAGE FACILITY AND SUBSTRATE PROCESSING FACILITY, AND METHOD FOR OPERATING SUBSTRATE STORAGE

(75) Inventor: Yoshiteru Ikehata, Yasu (JP)

(73) Assignee: Daifuku Co., Ltd., Osaka (JP)

( * ) Notice: Subject to any disclaimer, the term of this patent is extended or adjusted under 35 U.S.C. 154(b) by 761 days.

(21) Appl. No.: 11/900,630

(22) Filed: Sep. 12, 2007

(65) Prior Publication Data
US 2008/0069672 A1   Mar. 20, 2008

(30) Foreign Application Priority Data

Sep. 13, 2006 (JP) ................................ 2006-248172

(51) Int. Cl.
*H01L 21/677* (2006.01)

(52) U.S. Cl. ........................................ 414/217; 414/805

(58) Field of Classification Search .............. 414/217, 414/217.1, 805, 937, 938, 940, 806, 807; 454/187
See application file for complete search history.

(56) References Cited

U.S. PATENT DOCUMENTS

| 2,158,074 | A | * | 5/1939 | Kilb | ............................... 454/313 |
|---|---|---|---|---|---|
| 3,073,039 | A | * | 1/1963 | Williams | ........................ 34/231 |
| 5,048,164 | A | * | 9/1991 | Harima | ........................ 29/25.01 |
| 5,162,047 | A | * | 11/1992 | Wada et al. | ................... 29/25.01 |
| 5,221,201 | A | * | 6/1993 | Yamaga et al. | ................ 432/241 |
| 5,261,935 | A | * | 11/1993 | Ishii et al. | ....................... 96/400 |
| 5,370,576 | A | * | 12/1994 | Krofchalk | ..................... 454/143 |
| 5,464,313 | A | * | 11/1995 | Ohsawa | ........................ 414/172 |
| 5,464,475 | A | * | 11/1995 | Sikes et al. | ..................... 118/719 |
| 5,468,112 | A | * | 11/1995 | Ishii et al. | ................ 414/416.03 |
| 5,525,106 | A |   | 6/1996 | Iizuka et al. |   |
| 5,562,383 | A | * | 10/1996 | Iwai et al. | ................... 414/217.1 |
| 5,788,448 | A | * | 8/1998 | Wakamori et al. | ........ 414/222.02 |
| 5,810,538 | A | * | 9/1998 | Ozawa et al. | ................. 414/217 |
| 5,853,486 | A | * | 12/1998 | Ono et al. | ..................... 118/719 |
| 6,092,980 | A | * | 7/2000 | Kumasaka et al. | ........... 414/804 |
| 6,318,944 | B1 | * | 11/2001 | Shimeno et al. | .............. 414/172 |

(Continued)

FOREIGN PATENT DOCUMENTS

JP    4131636 A    5/1992

(Continued)

*Primary Examiner* — Saul Rodriguez
*Assistant Examiner* — Glenn Myers
(74) *Attorney, Agent, or Firm* — The Webb Law Firm

(57) ABSTRACT

Substrate storage facility includes a container that holds a plurality of the substrates with the substrates lined up vertically with space therebetween and that is tubular having a generally quadrangular cross section, the container including a first opening provided on one end side and a second opening provided on the other end side spaced apart in a horizontal direction from the first opening, the first opening serving as an entrance for loading and unloading the substrate; a fan filter unit, provided in an area of the second opening of the container, that causes movement of air from the second opening toward the first opening; and a controller that controls an operation of the container transfer device such that the container is stored in the storage section with a side of the container where the fan filter unit is provided is positioned toward the traveling space, and the entrance side of the container is positioned away from the traveling space.

8 Claims, 18 Drawing Sheets

U.S. PATENT DOCUMENTS

| | | | |
|---|---|---|---|
| 6,439,822 B1 * | 8/2002 | Kimura et al. | 414/331.04 |
| 6,641,349 B1 * | 11/2003 | Miyajima et al. | 414/217 |
| 6,770,109 B2 * | 8/2004 | Tanaka et al. | 55/385.6 |
| 7,073,999 B2 * | 7/2006 | Oyama | 414/217 |
| 7,077,614 B1 * | 7/2006 | Hasper et al. | 414/217 |
| 7,357,846 B2 * | 4/2008 | Fujishima | 156/345.32 |
| 2004/0187451 A1 * | 9/2004 | Suzuki et al. | 55/385.1 |

FOREIGN PATENT DOCUMENTS

| | | | |
|---|---|---|---|
| JP | 2001060610 A | * | 3/2001 |
| JP | 2001130708 A | | 5/2001 |
| JP | 2001308169 A | | 11/2001 |
| JP | 2003-081406 | | 3/2003 |
| JP | 2003252405 A | | 9/2003 |

* cited by examiner

FIG.17
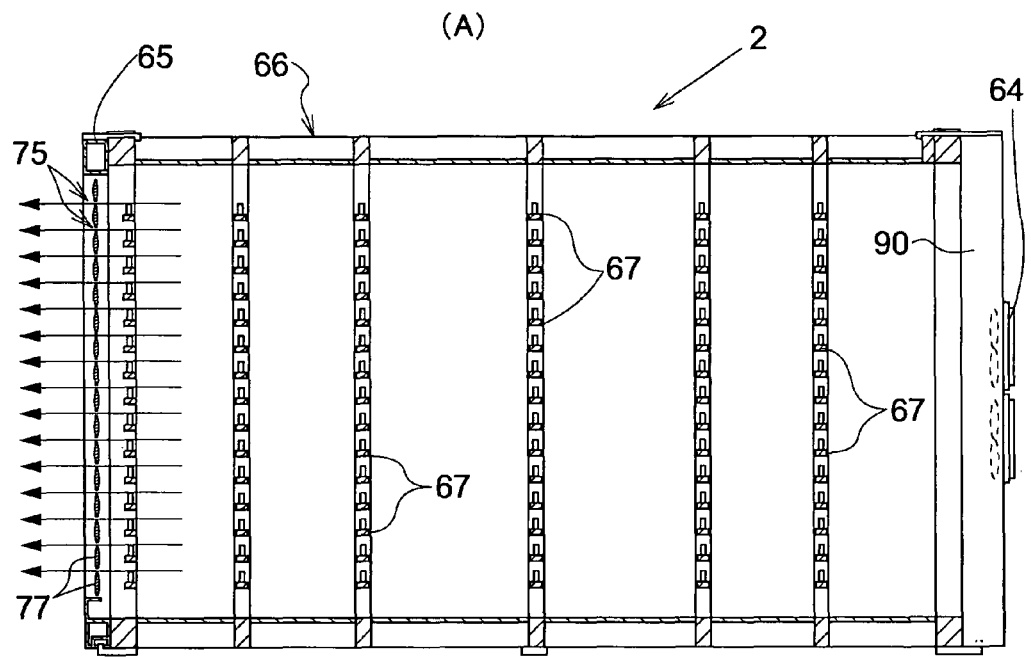
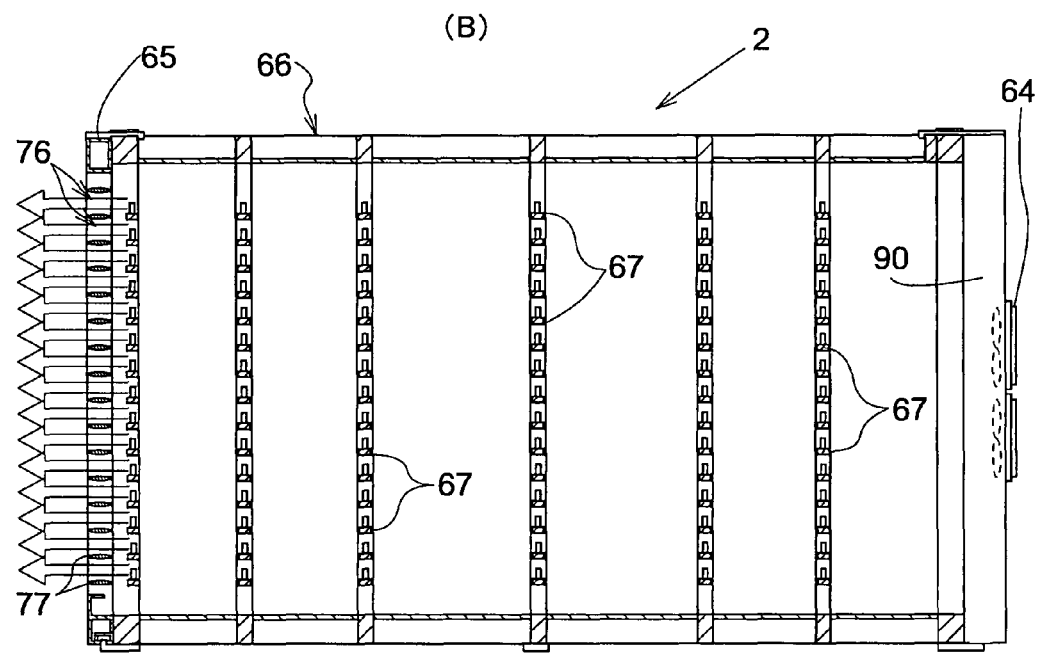

SUBSTRATE STORAGE FACILITY AND SUBSTRATE PROCESSING FACILITY, AND METHOD FOR OPERATING SUBSTRATE STORAGE

BACKGROUND OF THE INVENTION

The present invention relates to substrate storage facility that includes a storage shelf including a plurality of storage sections where a container is stored that vertically holds a plurality of rectangular-shaped substrates aligned at certain intervals, a loading/unloading section for the container, a container transfer device configured so as to travel in a traveling space in front of the storage shelves in the direction of the shelf longitudinal width that transfers the container to the loading/unloading section and the storage section, and a control means that controls operations of the container transfer device, as well as the method for operating the same.

The substrate storage facility described above stores in the storage shelf containers each of which vertically holds a plurality of substrates such as glass substrates used for liquid display devices or plasma display devices, aligned at certain intervals. Also, loading and unloading of the containers are carried out by the container transfer device transferring the containers between the loading/unloading section and the storage sections.

In such substrate storage facility, the container is conventionally formed in a lattice shape so as to be capable of passing outside air through the container, and such substrate storage facility includes a clean air ventilation means that performs ventilation from a ceiling portion to a floor portion of a space where the storage shelves, the loading/unloading section and the container transfer device are provided, and a storage shelf fan filter unit that is provided in the rear side of the storage shelf and performs ventilation from that rear side to the front side, where the container transfer device exists. Then, by ventilating the traveling space from the ceiling side to the floor portion side with the clean air ventilation means, dust caused by the container transfer device is collected on the floor face side so as to make the space provided with the storage shelves, the loading/unloading section and the container transfer device a clean space, and thereby purity of substrates is maintained. Especially, when the container is stored in the storage shelves, as a result of ventilation from the rear side to the front side of the storage shelves by the storage shelf fan filter unit, the inside of the container is ventilated as well, which prevents adhesion of dust to the substrates and entry of dust caused by the container transfer device in the traveling space into the storage section. In this manner, purity of the substrates has been maintained (for example, see JP 2003-081406A).

In the above-described conventional substrate storage facility, provision of a high-performance clean air ventilation means with a high purifying effect has been required so as to make the space provided with the storage shelves, the loading/unloading section and the container transfer device a clean space that is clean enough to maintain purity of the substrates, which increased the cost of equipment. In addition, although high-speed traveling of the container transfer device has been in demand to improve transfer efficiency of substrates, high-speed traveling of the container transfer device significantly disturbs airflow and consequently, dust thereby stirred up from the floor side may enter the storage section and even inside the containers stored in the storage sections, which results in soiling of the substrates.

SUMMARY OF THE INVENTION

The present invention has been achieved in view of the above issues, and the object thereof is to provide substrate storage facility with which soiling of substrates is highly prevented.

The substrate storage facility of the present invention includes:

a container that holds a plurality of the substrates with the substrates lined up vertically with space therebetween and that is tubular having a generally quadrangular cross section, the container including a first opening provided on one end side and a second opening provided on the other end side spaced apart in a horizontal direction from the first opening, the first opening serving as an entrance for loading and unloading the substrates;

a fan filter unit, provided in an area of the second opening of the container, that causes movement of air from the second opening toward the first opening;

a storage shelf including a plurality of storage sections, each of which is adapted to store the containers;

a loading/unloading section for the container;

a container transfer device that is configured to travel in a shelf longitudinal width direction in a traveling space in front of the storage shelf and that transfers the containers between the loading/unloading section and the storage sections; and a controller that controls an operation of the container transfer device such that the container is stored in the storage section with a side of the container where the fan filter unit is provided is positioned toward the traveling space, and the entrance side of the container is positioned away from the traveling space.

That is, the container is formed in a tube shape, with the first opening on one end side thereof serves as an entrance for loading/unloading the substrate, and the fan filter unit that performs ventilation from the second opening on the other end side of the container toward the entrance is provided in the second opening area on the other end side of the container. Dust present in the container is prevented from attaching to the substrate and the outside air is efficiently prevented from entering the container by performing ventilation with clean air from the second opening on the other end side toward the entrance of the container with the fan filter unit, with the clean air being discharged from the entrance.

Furthermore, the container is stored in the storage section in a state in which the side of the container on which the fan filter unit is provided is positioned on the side toward the traveling space, and the side of the container toward the entrance is positioned on the side away from the traveling space. Therefore, even if dust stirred up from the floor side due to disturbed airflow caused when the container transfer device is operated enters the storage section, such dust is removed by the fan filter unit disposed at the traveling space side of the container. As a result, dust is prevented from entering into inside the container stored in the storage section, and soiling of the substrate is highly prevented.

BRIEF DESCRIPTION OF THE DRAWINGS

FIG. 17 is a side view illustrating closed and open states of the lid.

DETAILED DESCRIPTION OF PREFERRED EMBODIMENTS

The following is a description of preferred embodiments of the present embodiment, with reference to the accompanying drawings.

Figure 2:
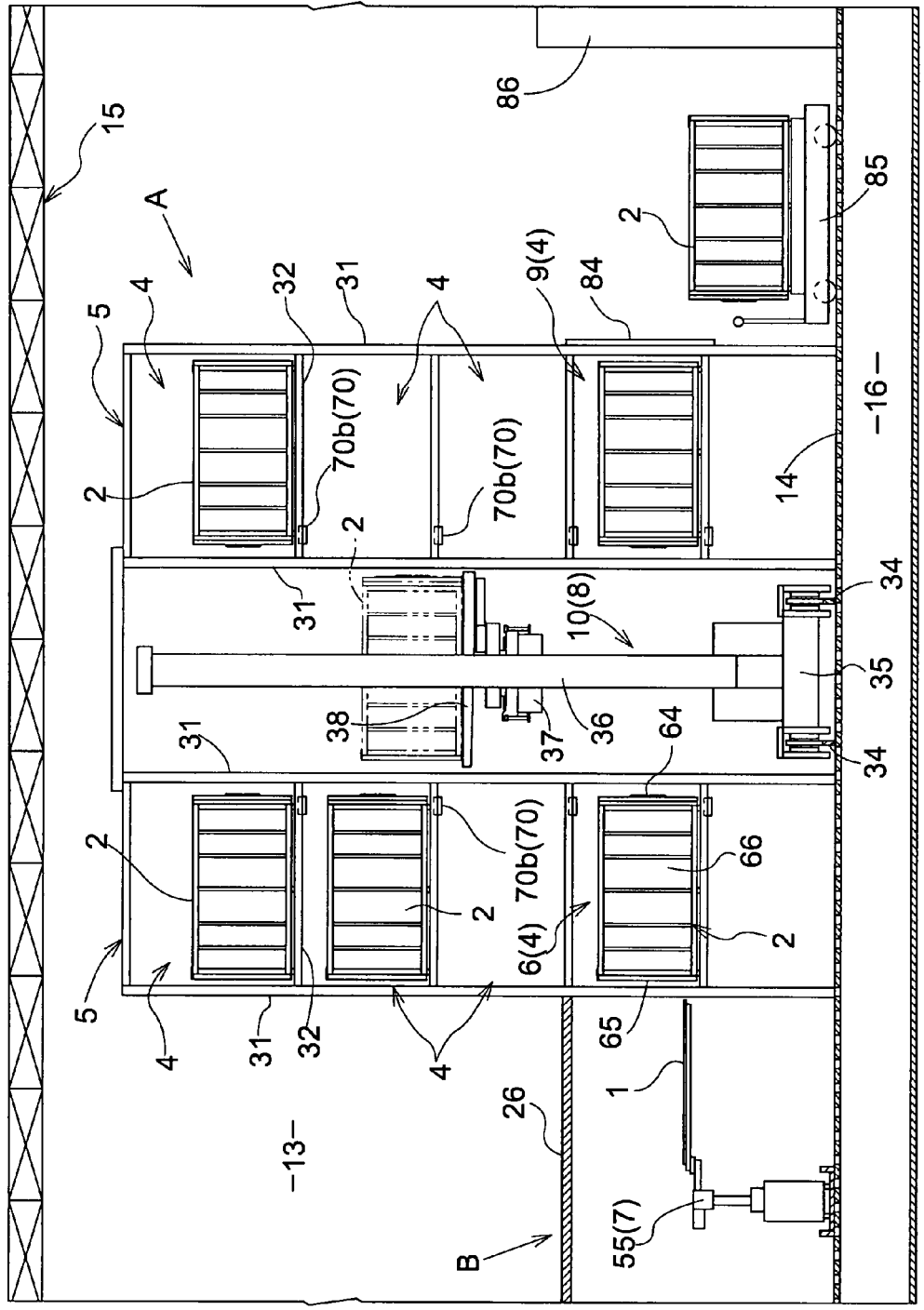
FIG. 2 is a front view of substrate storage facility.
Figure 6:
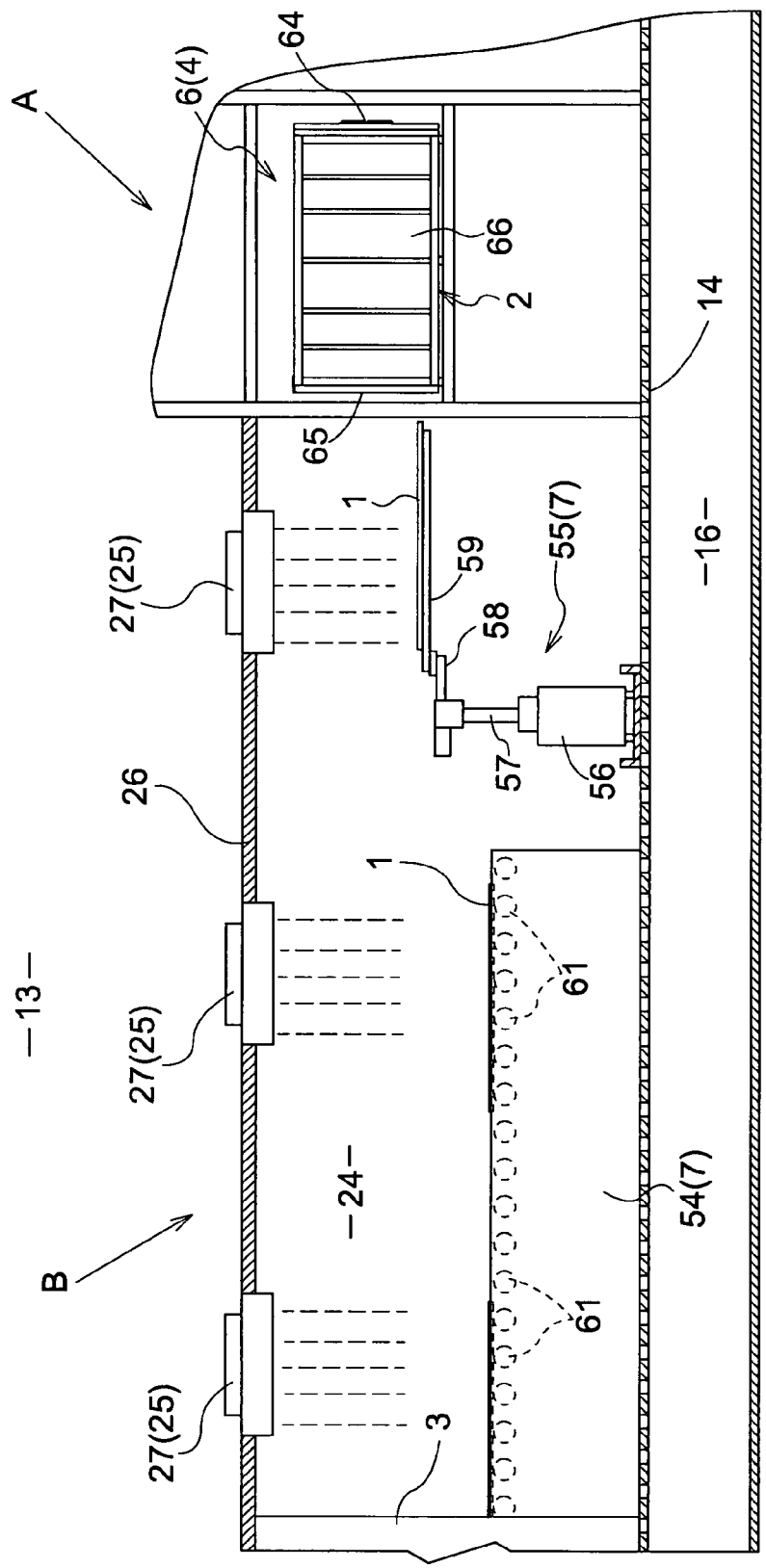
FIG. 6 is a side view illustrating a substrate transfer area.
Figure 7:
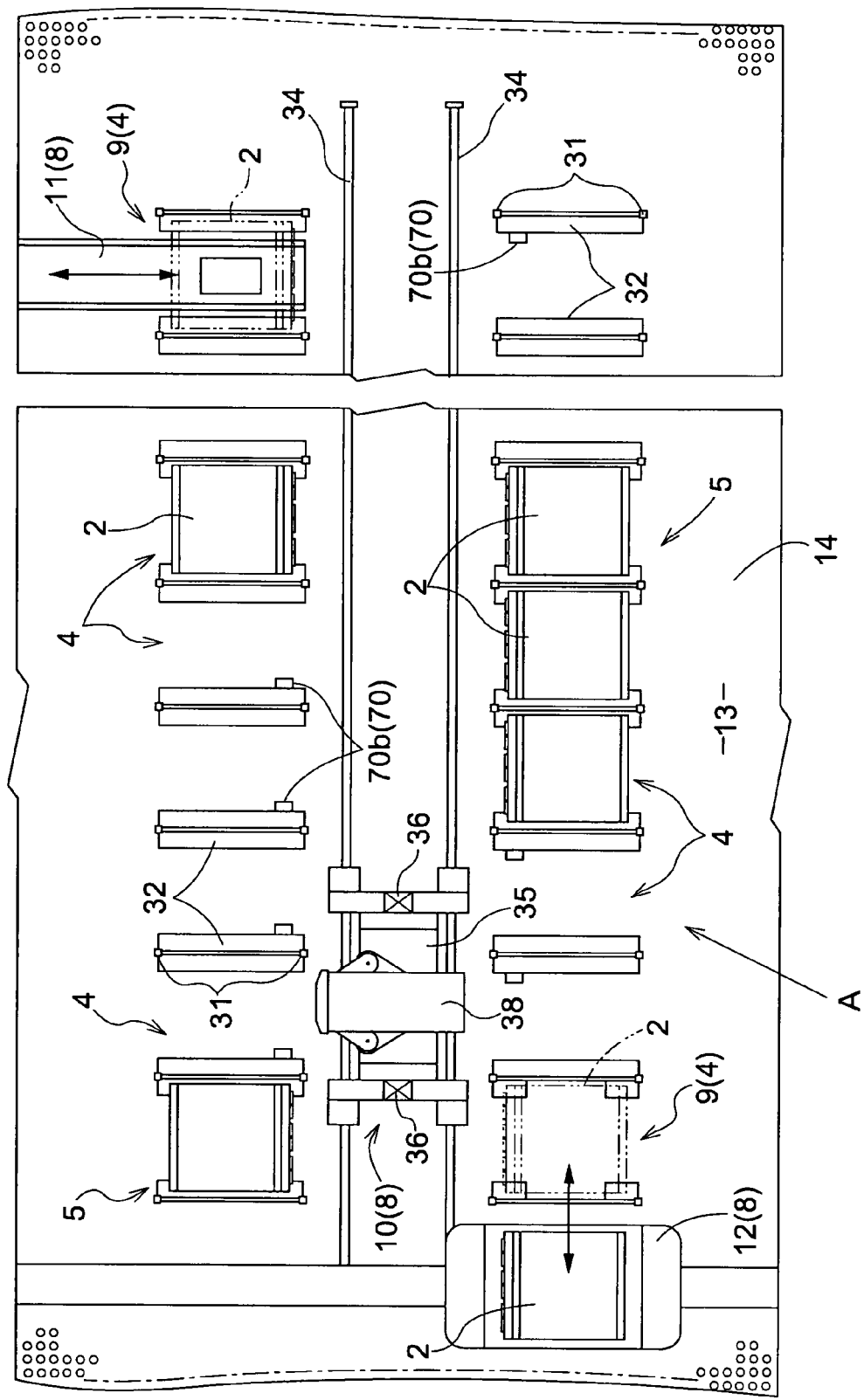
FIG. 7 is a diagram illustrating a storage section at the third level of the storage shelf.

As shown in FIGS. 2 and 6, Substrate processing facility includes a plurality of substrate processing devices 3 that process a substrate 1 having, for example, a rectangular shape, a storage shelf 5 including a plurality of storage sections 4 that store a container 2 that vertically holds a plurality of substrates 1 aligned at certain intervals, a substrate transfer device 7 that takes out the substrates 1 one at a time from the container 2 positioned in a substrate loading/unloading section 6 for each of a plurality of the substrate processing device 3 so as to supply the substrate taken out to the corresponding substrate processing device 3, and store the substrate 1 removed from the substrate processing device 3 into the container 2 positioned in the substrate loading/unloading section 6, and a container transfer device 8 that transfers the container 2 to the substrate loading/unloading section 6 of each of the plurality of the substrate processing devices 3 and the storage sections 4 of the storage shelf 5. The substrate 1 may have a circular shape.

Figure 1:
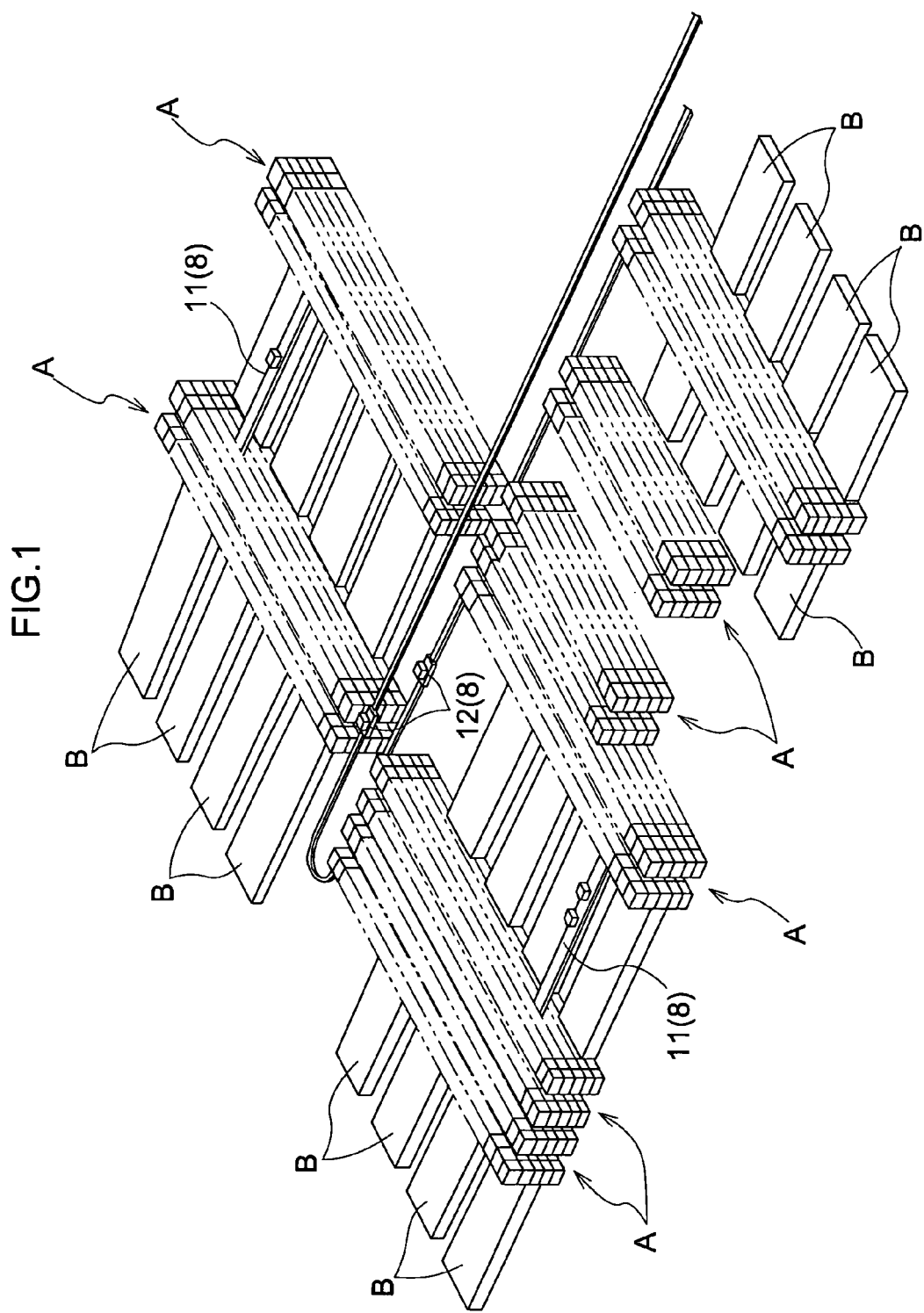
FIG. 1 is a perspective view of Substrate processing facility.

As shown in FIG. 1, the Substrate processing facility is provided with plural units of substrate storage facility A and process step equipment B. As shown in FIG. 2, each unit of Substrate processing facility A includes the storage shelf 5 and a stacker crane 10 as the container transfer device 8. Also as shown in FIG. 6, each unit of process step equipment B includes the substrate processing device 3 and the substrate transport device 7.

This Substrate processing facility employs a substrate processing method in which the containers 2 are stored in the storage shelf 5 and the stored containers 2 are sequentially transferred to the substrate loading/unloading section 6 of each of a plurality of the substrate processing devices 3, and then the substrates 1 are sequentially processed by a plurality of the substrate processing devices 3 so as to manufacture processed substrates.

That is, operations of the substrate transfer device 7 and the container transfer device 8 are controlled by a control device (not shown). The control device controls operations of the substrate transfer device 7 and the container transfer device 8 as follows. The container transfer device 8 sequentially transfers the containers 2 to the substrate loading/unloading section 6 of each of a plurality of the substrate processing devices 3. Every time the container 2 is transferred to the substrate loading/unloading section 6, the substrate transfer device 7 takes out the substrates 1 one at a time from the container 2 so as to supply the substrate 1 taken out to the substrate processing device 3, and stores the substrate 1 removed from the substrate processing device 3 in the container 2. This control device includes components such as microprocessor, a communication section, a memory, algorithms stored in the memory, which are required to perform all functions described in this specification. In addition, this control device may be arranged on the floor of the equipment, or may be arranged in the container transfer unit or the storage shelf 5.

A plurality of substrate processing devices 3 independently perform prescribed processes such as coating, exposure and developing, and therefore they sometimes vary in the processing amount of the substrate 1. The control device controls operations of the container transfer device 8 such that when any time lag occurs in processing a certain substrate 1 during sequential transfer to the loading/unloading section 6, the container 2 that stores the certain substrate 1 to be processed is temporarily stored in the storage shelf 5.

As the container transfer device 8, the stacker crane 10, which is a container transfer unit for the storage shelf and provided corresponding to the storage shelf 5, and a reciprocating trolley 11 and a circulating trolley 12, which are container transfer units between shelves that transfer the container 2 between a plurality of loading/unloading sections 9 in each of a plurality of storage shelves 5, are provided.

As shown in FIG. 1, the reciprocating trolley 11 and circulating trolley 12 transfer the container 2 outside the substrate storage facility A. The reciprocating trolley 11 reciprocates between two adjacent units of substrate storage facility A, and transfer the container 2 between the two adjacent units. The circulating trolley 12 circulates around plural units of substrate storage facility A, and transfer the container 2 to these plural units.

Also as shown in FIG. 2, the stacker crane 10 transfers the container 2 inside the substrate storage facility A, and reciprocates along a traveling space created between a pair of storage shelves 5 arranged facing each other so as to transfer the container 2 between a plurality of storage sections 4 of a pair of the facing storage shelves 5.

Specifically, when the container 2 is transferred to the storage section 4 or the substrate loading/unloading section 6 (as origin of transfer) to the storage section 4 or the substrate loading/unloading section 6 (as transfer destination) with the container transfer device 8, if the origin of transfer and the transfer destination are in different units of substrate storage facility A, the container 2 is sequentially transferred in a relayed manner by the stacker crane 10 of the substrate storage facility A as the origin of transfer, reciprocating trolley 11, circulating trolley 12, and the stacker crane 10 of the substrate storage facility A as the transfer destination, in this order. If the origin of transfer and the transfer destination are in the same unit of substrate storage facility A, the container 2 is transferred by the stacker crane 10 of that unit of substrate storage facility A.

Figure 4:
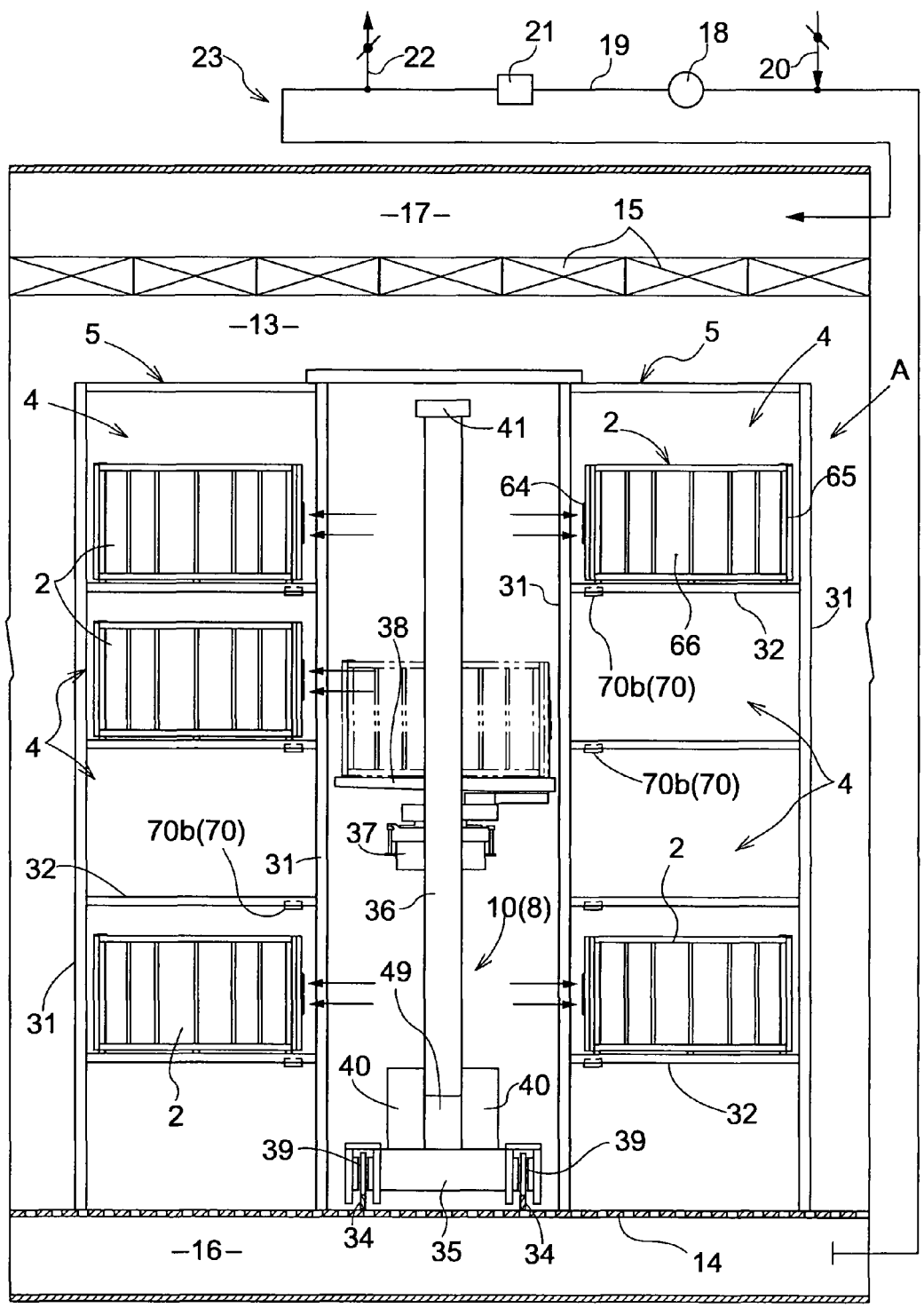
FIG. 4 is a diagram illustrating a clean air ventilation means.

As shown in FIG. 4, the Substrate processing facility includes a down-flow type clean air ventilation means 23, which ventilates a clean space 13 with clean air (or filtered air) from the ceiling portion to the floor portion of the clean space 13. In the clean space 13 with the down-flow ventilation, a plurality of substrate processing devices 3, the storage shelve 5, the substrate transfer device 7, and the container transfer device 8 are provided. The substrate storage facility A is provided so as to be open to the surrounding area, and is configured such that clean air can flow into and from the substrate storage facility A.

Further explanation of the clean air ventilation means 23 is provided below. As shown in FIG. 4, in the clean air ventilation means 23, the floor portion of the clean space 13 is formed by a porous grating floor 14, and the ceiling portion of the clean space 13 is formed by an air filter 15 composed of an HEPA filter and the like. An air intake chamber 16 formed below the grating floor 14 and a chamber 17 formed above the air filter 15 are communicated via a circulation path 19 provided with a ventilation fan 18 and a pre-filter 21. With the ventilation fan 18, air in the clean space 13 is taken in to the circulation path 19 via the grating floor 14 and the air intake chamber 16, and the air taken in is blown downward to the clean space 13 as clean air via the pre-filter 21, the chamber 17 and the air filter 15. In this manner, air in the clean space 13 is circulated while being purified with the pre-filter 21 and the air filter 15, thereby passing clean air from the ceiling portion to the floor portion. The circulation path 19 is connected to an outside air intake path 20 on the upstream side from the ventilation fan 18, and an air discharge path 22 on the downstream side from the ventilation fan 18, and part of air in the clean space 13 circulated by the clean air ventilation means 23 is exchanged with outside air.

As shown in FIG. 6, the Substrate processing facility includes a clean air ventilation means for transfer area 25 that ventilates a transfer area with clean air in order to maintain purity of a substrate transfer area 24 where the substrate transfer device 7 transfers the substrates 1 between the substrate loading/unloading section 6 and the substrate processing device 3.

That is, in the substrate transfer area 24 of the process step equipment B, a partition wall 26 that covers the space for substrate transfer operation by the substrate transfer device 7, such that the end portion thereof on the side toward the storage shelf 5 is open and the other end portion thereof on the side toward the substrate processing device 3 is communicated with the substrate processing device 3. A plurality of transfer area fan filter units 27 as the clean air ventilation means for transfer area 25 are provided in the ceiling portion of the partition wall 26. Clean air obtained by further purifying clean air in the clean space 13 by a plurality of transfer area fan filter units 27 is passed from the ceiling portion to the floor portion of the substrate transfer area 24, thereby making the space covered by the partition wall 26 a down-flow ventilation space.

Figure 3:
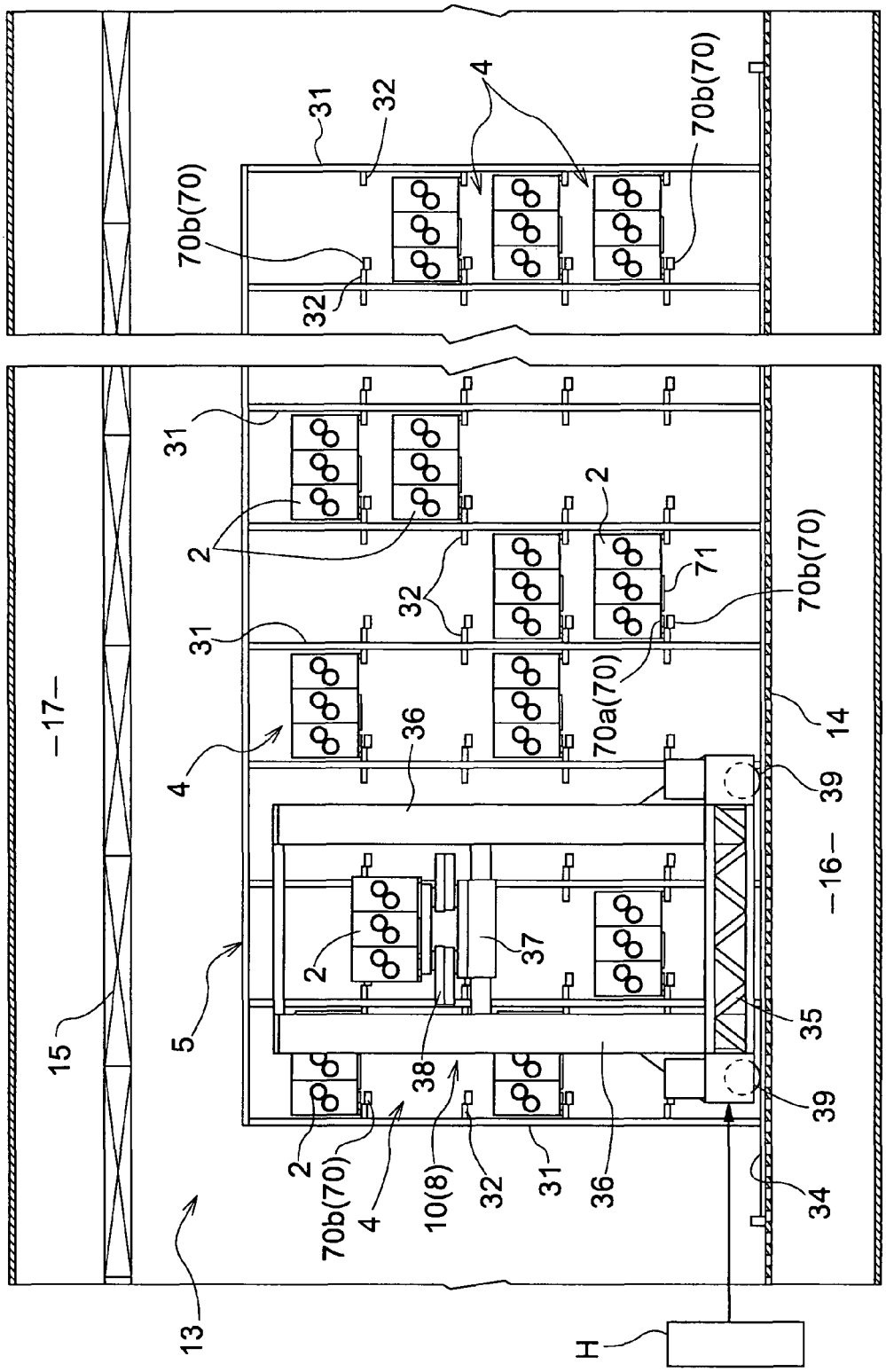
FIG. 3 is a side view of the substrate storage facility.

As shown in FIGS. 2 to 4, the storage shelf 5 is constituted by a pair of front and rear columns 31 provided erect on the grating floor 14 and spaced apart in the shelf longitudinal width direction, and mount and support sections 32 disposed bridging the pair of front and rear columns 31 and arranged at certain intervals in the vertical direction.

In the storage shelf 5, a plurality of storage sections 4, which are formed by a pair of front and rear column 31 and a pair of right and left mount and support sections 32, are provided arranged vertically and horizontally. The storage sections 4 adjacent in the shelf longitudinal width direction and the vertical direction are communicated to each other such that air can flow therethrough.

The storage sections 4 at the lowest level are arranged above the grating floor 14 so as to create an interval between them. Below the storage sections 4 at the lowest level, a flow space is formed where clean air flows.

Part of a plurality of storage sections 4 of the storage shelf 5 serve as the substrate loading/unloading section 6, and part of a plurality of storage sections 4 of the storage shelf 5 serve as the loading/unloading section 9.

Figure 5:
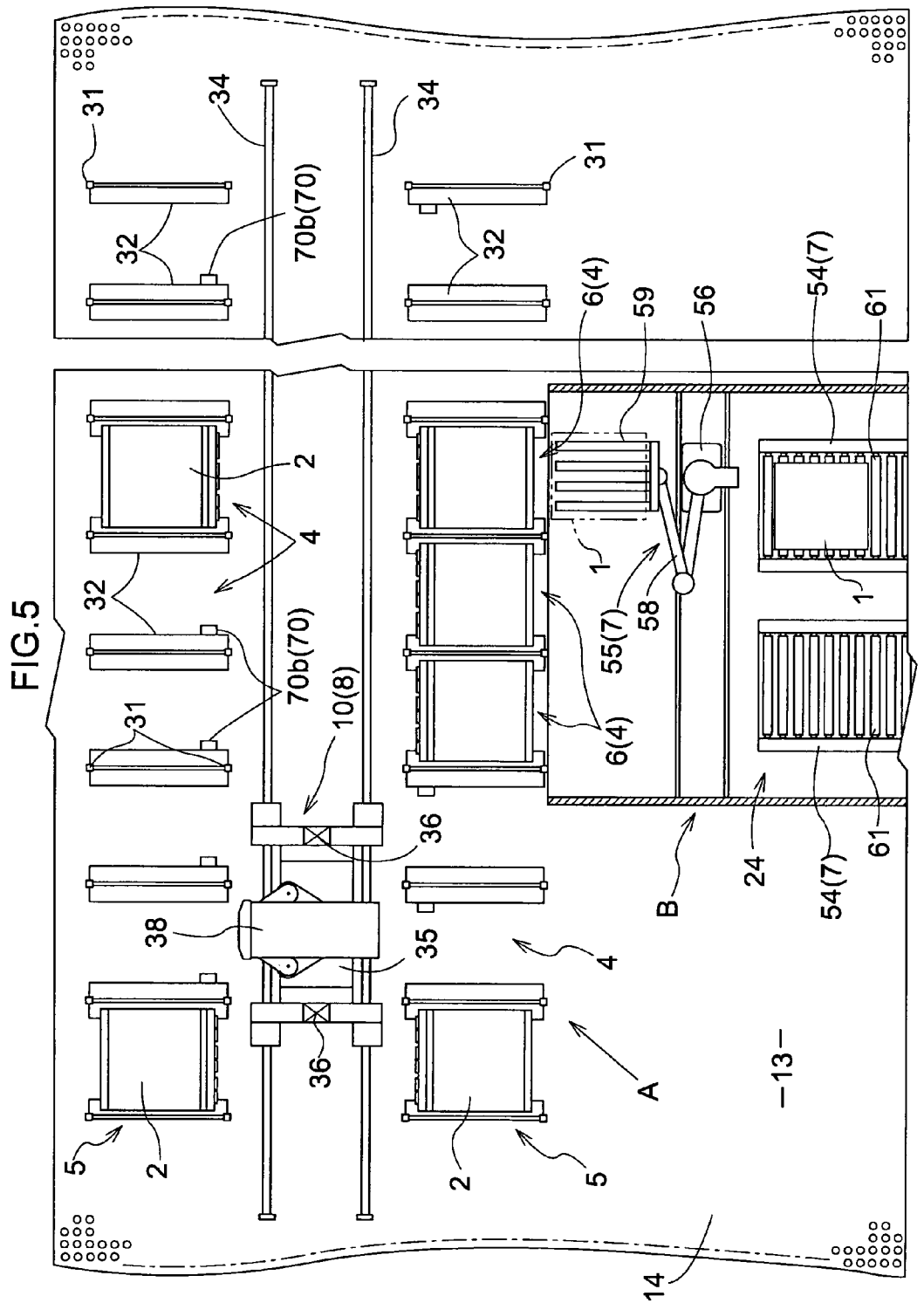
FIG. 5 is a diagram illustrating a storage section at the first level of a storage shelf.

Further description is provided below. As shown in FIG. 5, of a plurality of storage sections 4 at the lowest level of the storage shelf 5, the storage sections 4 that correspond to the substrate processing device 3 serve as the substrate loading/unloading section 6, which are configured such that the substrate transfer device 7 can take out or store the substrates 1 one at a time through the rear face side of the storage shelf 5 with respect to the container 2 positioned in the substrate loading/unloading section 6. Further, since the storage sections at the lowest level are arranged above the grating floor 14 so as to create an interval between them as described above, the substrate loading/unloading section 6 is positioned higher than the floor portion.

As shown 7, of a plurality of storage sections 4 at a middle level of the storage shelf 5, the storage sections 4 that correspond to the reciprocating trolley 11 and the circulating trolley 12 serve as the loading/unloading sections 9. The loading/unloading section 9 that corresponds to the reciprocating trolley 11 is configured such that the container 2 can be loaded and unloaded through the rear face side of the storage shelf 5 by the reciprocating trolley 11, and further, the loading/unloading section 9 that corresponds to the circulating trolley 12 is configured such that the container 2 can be loaded and unloaded through the lateral face side of the storage shelf 5 by the circulating trolley 12.

Figure 8:
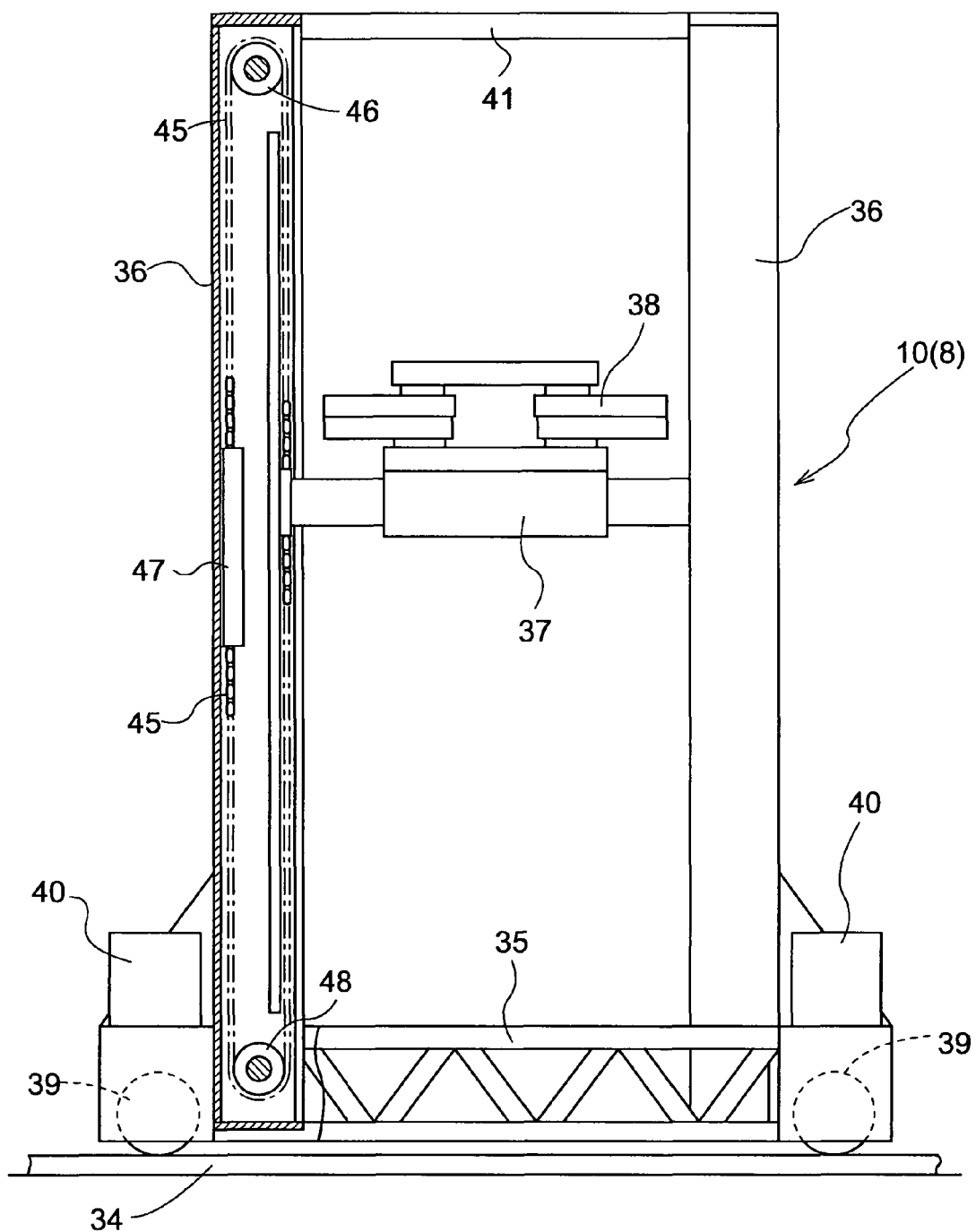
FIG. 8 is a side view of a stacker crane.

As shown in FIGS. 2, 3 and 8, the stacker crane 10 includes a travel dolly 35 that travels along two travel rails 34 disposed along the longitudinal direction on the travel path in front of the storage shelf 5, an elevator platform 37 guided and supported by a pair of elevator masts 36 so as to be capable of freely ascending and descending along the elevator masts 36 provided erect on the travel dolly 35, and a folk-type article transfer device 38 supported by the elevator platform 37 capable of transferring the container 2 between the storage section 4 and itself. The stacker crane 10 can freely travel in the traveling space in front of the storage shelf 5 in the shelf longitudinal width direction due to horizontal motion of the travel dolly 35, ascending/descending motion of the elevator platform 37 and operations of the article transfer device 38, and transfers the container 2 to the substrate loading/unloading section 6, the loading/unloading section 9 and the storage sections 4 of the storage shelf 5 other than those serving as the substrate loading/unloading section 6 or the loading/unloading section 9.

The travel dolly 35 is provided with a total of four travel wheels 39, two front and rear tires for each of two travel rails 34, and a travel motor 40 rotationally drives each travel wheel 39 so that the travel dolly 35 travels along the travel path.

The respective upper end portions of a pair of elevator masts 36 are connected via an upper frame 41.

As shown in FIG. 8, to each of end portions in the front-and-rear direction of the elevator platform 37, one end portions of a pair of elevating chains 45 are connected. One of the pair of elevating chains 45 is wound around a guiding sprocket 46 provided in an upper end portion of the elevator mast 36 with the other end thereof being connected to a balance weight 47. The other of the pair of elevating chains 45 is wound around a driving sprocket 48 provided in a lower end portion of elevator mast 36 with the other end thereof being connected to the balance weight 47. By rotationally driving the driving sprocket 48 using an elevator motor 49, the elevator platform 37 is ascended and descended.

Figure 9:
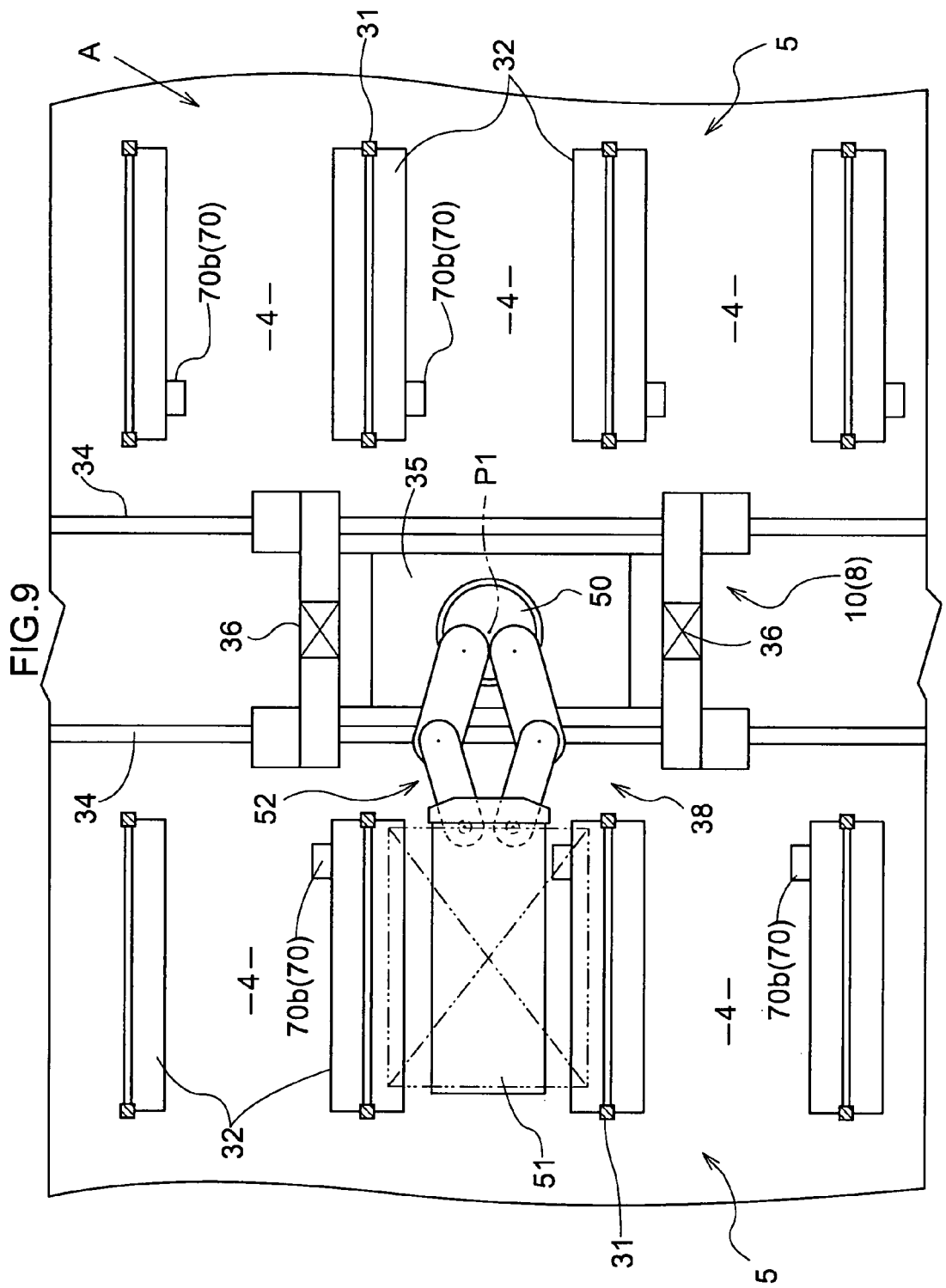
FIG. 9 is a plan view of an article transfer device.

As shown in FIG. 9, the article transfer device 38 includes a revolving table 50 capable of freely revolving around a vertical axis core P1, and a link mechanism 52 that supports a mount section 51 provided above the revolving table 50 such that the mount section 51 can be freely extended and withdrawn. The article transfer device 38 can move the mount section 51 in a revolving manner through revolution of the revolving table 50, and also can switch the state thereof between a state withdrawn above the elevator platform 37 (see FIG. 5) and a state extended toward the storage section 4, due to extension and retraction of the link mechanism 52. The article transfer device 38 corresponds to a revolving means that enables revolving of the container 2 supported.

As shown in FIG. 3, the substrate storage facility A includes a controller H that controls operations of the stacker crane 10.

The controller H is configured so as to control operations of the stacker crane 10 such that the container 2 is transferred between a plurality of storage sections 4, by controlling operations of the travel motor 40, the elevator motor 49 and the article transfer device 38 based on instructions of a superior control device that manages operations of the container transfer device 8.

The controller H, in both of a pair of the storage shelves 5, is configured so as to control operations of the container transfer device 8 such that the container 2 is stored in the storage section 4 in a state in which the side of the container 2 on which a fan filter unit 64 is provided is positioned on the side toward the traveling space, and the side of the container 2 toward an entrance 72 is positioned on the side away from the traveling space. The fan filter unit 64 (also referred to as FFU) includes a fan, an electric motor that drives the fan, a filter, a battery 71 and a power receiving section 70a that transfer power to the battery 71 or the electric motor, which are supported by a single FFU frame unit 90. The fan revolves around an axis that extends horizontally.

That is, the controller H is configured so as to control operations of the stacker crane 10 such that, when the container 2 is transferred between a pair of facing storage shelves 5, if the storage section 4 as the origin of transfer and the storage section 4 as the transfer destination are in the same storage shelf 5, a container 2 is removed from the storage section 4 as the origin of transfer, and stored in the storage section 4 as the transfer destination without revolving the container 2 by the article transfer device 38, so that the container 2 is stored, also in the storage section 4 as the transfer destination, in a state in which the side of the container 2 on which the fan filter unit 64 is provided is positioned on the side toward the traveling space, and the side of the container 2 on which a lid 65 is provided (the entrance side) is positioned on the side away from the traveling space, as in the storage section 4 as the origin of transfer. Furthermore, the controller H is configured so as to control operations of the stacker crane 10 such that, if the storage section 4 as the origin of transfer and the storage section 4 as the transfer destination are in different storage shelves 5, the container 2 is removed from the storage section 4 as the origin of transfer, and stored in the storage section 4 as the transfer destination after revolving the container 2 by 180 degrees with the article transfer device 38, so that the container 2 is stored, also in the storage section 4 as the transfer destination, in a state in which the side of the container 2 on which the fan filter unit 64 is provided is positioned on the side toward the traveling space, and the side of the container 2 on which the lid 65 is erected is positioned on the side away from the traveling space, as in the storage section 4 as the origin of transfer.

As shown in FIGS. 5 and 6, the substrate transfer device 7 includes a substrate transfer conveyer 54 that mounts and transfers the substrate 1 between the substrate processing device 3 and the vicinity of the storage shelf 5, a substrate transfer robot 55 that mounts and transfers the substrate 1 between the container 2 positioned in the substrate loading/unloading section 6 and the end portion of the substrate transfer conveyer 54 on the side toward the storage shelf.

The substrate transfer robot 55 includes a moving dolly 56 that moves in the rear face side of the storage shelf 5 along the shelf longitudinal width direction, and an elevating section 57 supported by the moving dolly 56 so as to be capable of freely accenting and descending, as well as rotating, and a folk-shaped support section 59 connected to the elevating section 57 via a link mechanism 58. The substrate transfer robot 55 is configured so as to transfer the substrates 1 one at a time from the container 2 positioned in the substrate loading/unloading section 6 to the end portion of the substrate transfer conveyer 54 on the side toward the storage shelf through accenting/descending and rotation of the elevating section 57, as well as extension and retraction of the link mechanism 58, and to transfer the substrates 1 at the end portion of the substrate transfer conveyer 54 on the side toward the storage shelf one at a time to the container 2 positioned in the substrate loading/unloading section 6.

As shown in FIG. 6, the substrate transfer conveyer 54 is configured so as to transfer the substrate 1 by rotationally driving a rotation roller 61, while the rotation roller 61 supporting the substrate 1 at both ends thereof in the longitudinal width direction. As shown in FIG. 5, as the substrate transfer conveyer 54, a pre-processing substrate transfer conveyer 54 that transfers unprocessed substrates 1 received from the substrate transfer robot 55 to the substrate processing device 3, and a post-processing substrate transfer conveyer 54 that transfers processed substrates 1 removed from the substrate processing device 3 toward the storage shelf 5 are provided.

Figure 11:
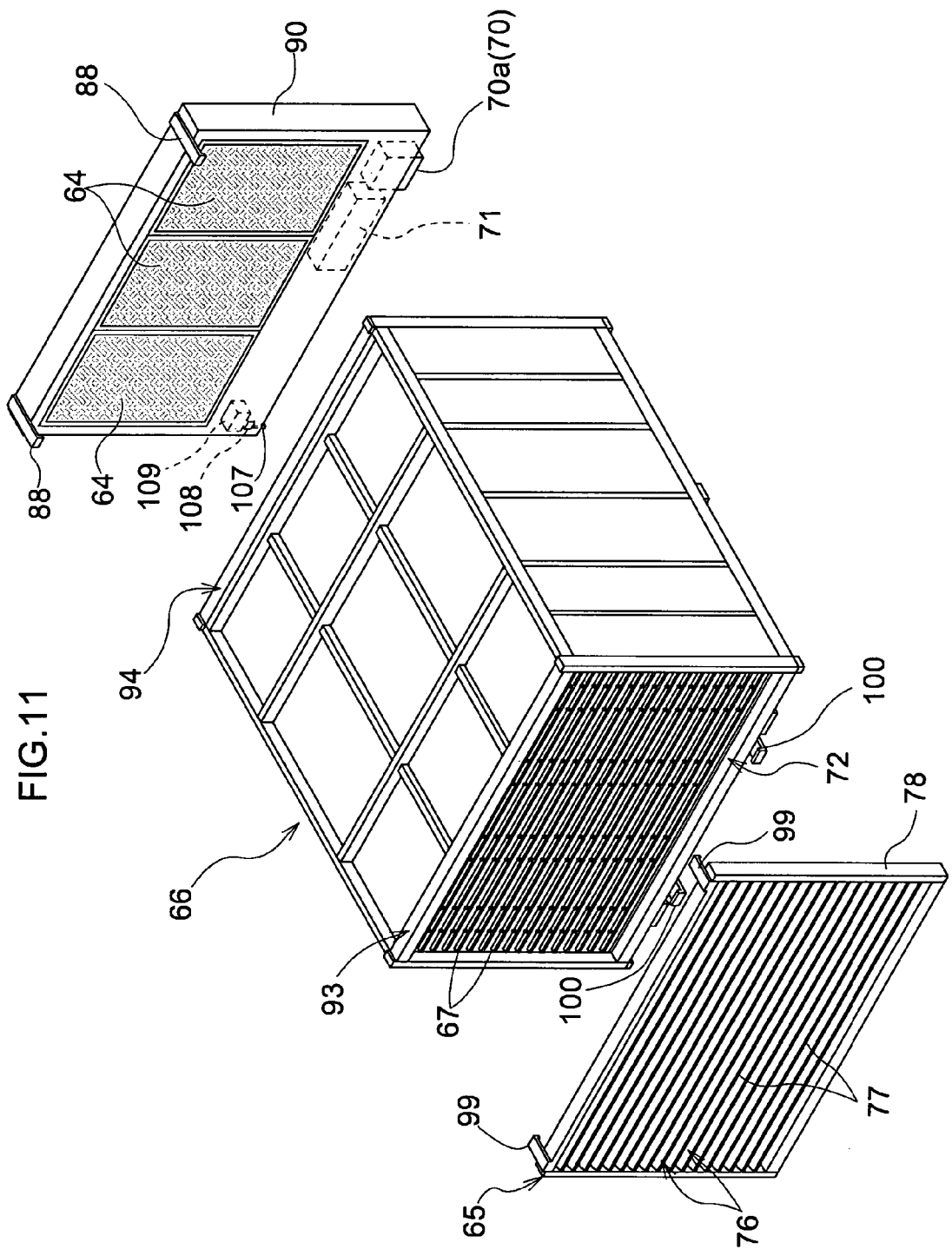
FIG. 11 is an exploded perspective view of a container.
Figure 12:
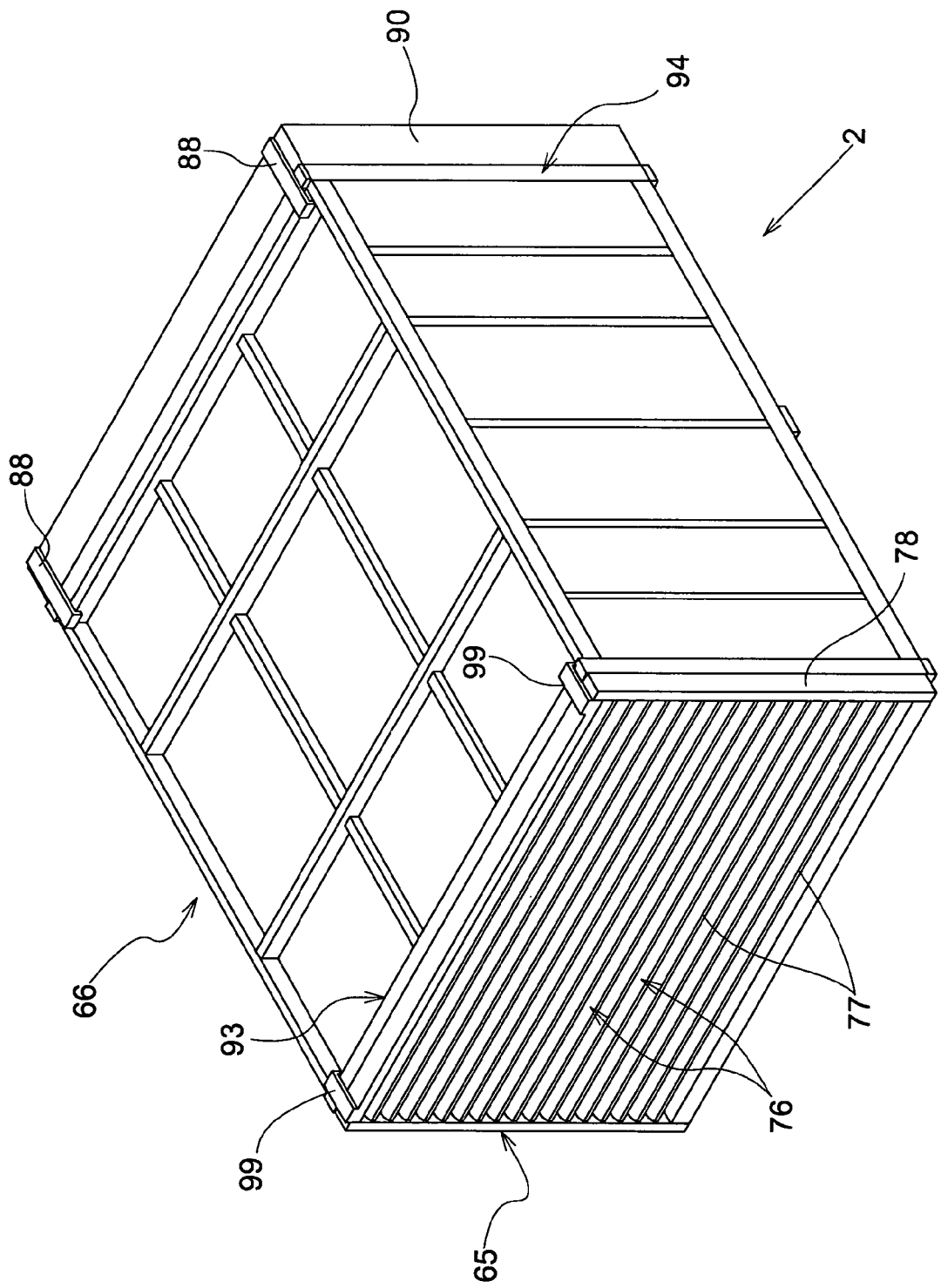
FIG. 12 is a perspective view of the container.

As shown in FIGS. 11 and 12, the container 2 is formed in a quadrangular tube shape turned over sideways. An opening on one end side of the container 2 (first opening) serves as the entrance 72 used for loading and unloading the substrate 1, the fan filter unit 64 that performs ventilation from an opening on the other end side of the container 2 (second opening) toward the entrance 72 is provided at the an opening portion on the other end side of the container 2 (namely, area of the second opening), and the lid 65 that opens and closes the entrance 72 of the container 2 is provided at the entrance portion of the container 2 such that the lid 65 partially opens in a closed state, and also allows transfer of the substrate 1 by the substrate transfer device 7 in an open state.

In other words, an opening at one end side of a container main unit 66 formed in a quadrangular tube shape turned over sideways is configured as the entrance 72 for loading and unloading the substrates 1 one at a time, the fan filter unit 64 that performs ventilation from an opening on the other end side of the container main unit 66 toward the entrance 72 is provided at an opening portion on the other end side of the container main unit 66, and the lid 65 that opens and closes the entrance 72 of the container main body 66, is provided at the entrance portion of the container main unit 66 such that the lid 65 partially opens as a vent hole 75 in a closed state, and also allows transfer of the substrate 1 by the substrate transfer device 7 in an open state.

Figure 10:
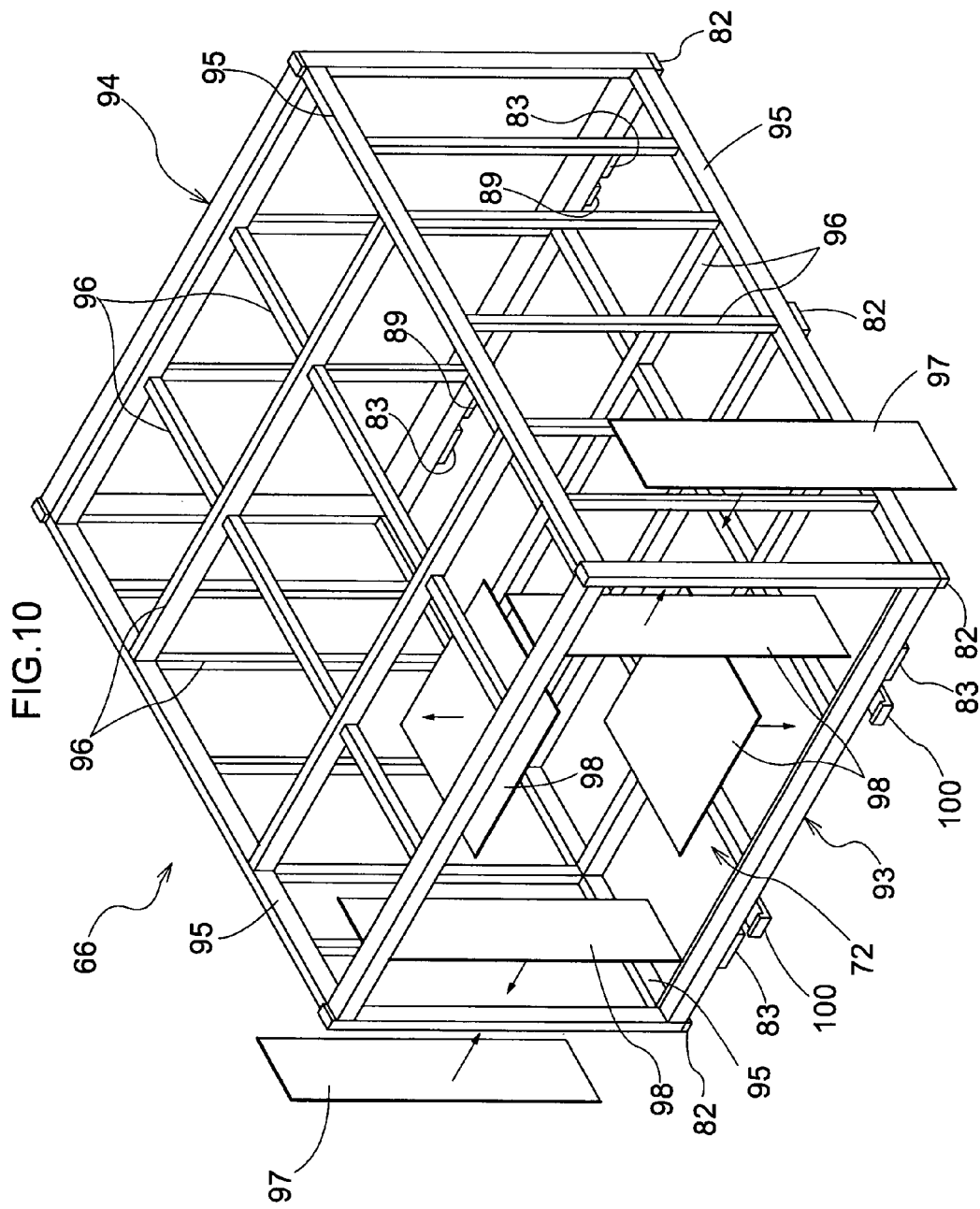
FIG. 10 is an exploded perspective view of a container main unit.

As shown in FIG. 10, the container main unit 66 is formed as a lattice-like frame using a one end side rectangular frame 93 having a rectangular shape that forms an opening on one end side of the container main unit 66, an other end side rectangular frame 94 having a rectangular shape as well that forms an opening on the other end side of the container main unit 66, corner frame members 95 that connects the one end side rectangular frame 93 and the other end side rectangular frame 94 at their respective corners, connecting frame members 96 appropriately bridging the other end side portion, right and left side portions, top and bottom portions other than the one end side portion of the container main unit 66. In both side portions, exterior surface members 97 provided so as to cover the opening formed in both side portions and form the same plane with the rectangular frame and frame members on the exterior surface side, and interior surface members 98 provided so as to form the same plane with the rectangular frame and frame members on the interior surface side are provided. In the top and bottom portions, the interior surface members 98 are provided so as to cover the openings formed in both of the top and bottom portions. In this manner, the container main unit 66 is formed in a quadrangular tube shape turned over sideways.

Then, in the one end side rectangular frame 93, the other end side rectangular frame 94 and the lower frame members 95, support sections for storage 82 are provided, at which the container main unit 66 is mounted and supported when stored in the storage section 4 of the storage shelf 5. In the one end side rectangular frame 93 and the other end side rectangular frame 94, support sections for transfer 83 are provided, at which the container main unit 66 is mounted and supported when transferred by the container transfer device 8 such as the stacker crane 10.

Figure 13:
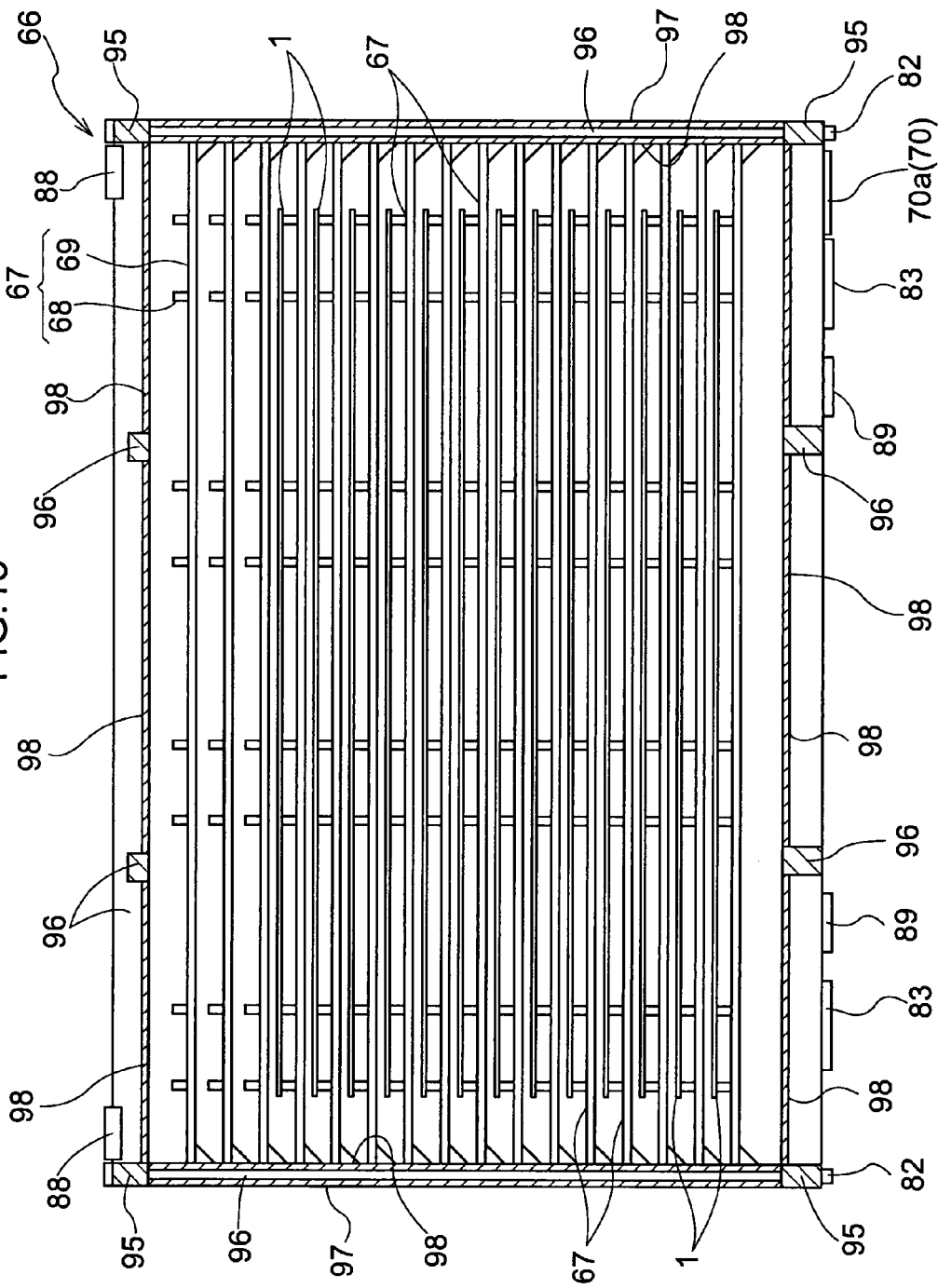
FIG. 13 is a vertical cross-sectional view of the container when viewed from the front.

As shown in FIGS. 13 and 17, in the container main unit 66, support members 67 bridge the right and left side wall portions thereof. A plurality of support members 67 are provided lined up in the front-and-rear direction to support a single substrate 1, and also arranged in plural vertical levels at set intervals such that the number of levels corresponds to the number of substrates 1 stored in the container 2.

As shown in FIG. 13, each support member 67 includes a main unit frame 69 bridging the connecting frame members 96 at the right and left side wall portions of the container main unit 66, and a plurality of pin members 68 provided erect thereon. The pin members 68 are provided erect at the set positions on the main unit frame 69 so as not to interfere with the support section 59 of the substrate transfer robot 55 while the substrate transfer robot 55 loads and unloads the substrate 1 to and from the container 2. By supporting the substrate 1 with a plurality of pin members 68, a gap is formed between the main unit frame 69 and the substrate 1 supported by the pin members 68, where the support section 59 of the substrate transport robot 55 is inserted.

As shown in FIG. 11, three fan filter units 64 are provided on the container main unit 66, and these three fan filter units 64 are attached to the FFU frame unit 90, which is joined to the opening portion of the other end side of the container main unit 66 so as to be supported, lined up in the longitudinal width direction of the FFU frame unit 90.

The FFU frame unit 90 is provided with the power receiving section 70a of a non-contact power supply device 70, and the three fan filter units 64 are operated with power supplied by a power supply section 70b (see FIG. 2) of the non-contact power supply device 70, which is provided supported by the mount and support section 32 in each storage section 4.

The FFU frame unit 90 also includes the battery 71 that stores power supplied to the power receiving section 70a. In the case in which a supply of power to the container 2 is stopped as a result of the power receiving section 70a being separated from the power supply section 70b, such as when the container 2 is transferred by the stacker crane 10, power stored in the battery 71 is used to operate the three fan filter units 64.

Next, the lid 65 is described.

Figure 16:
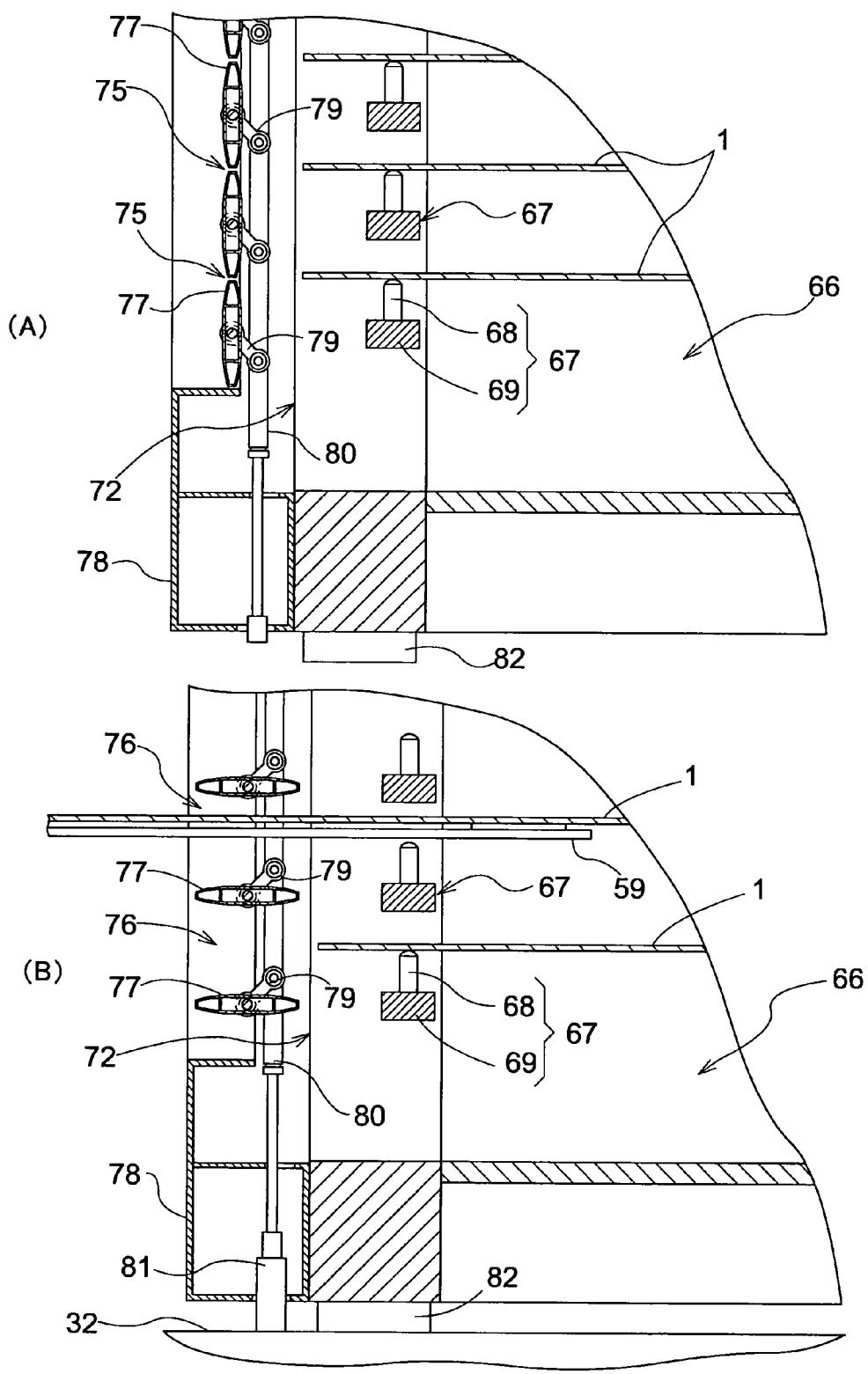
FIG. 16 is a side view illustrating closed and open states of the lid.

As shown in FIG. 16, the vent hole 75 in the lid 65 is formed in a slit shape extending horizontally over substantially the same length as the longitudinal width of the entrance 72, and a plurality of vent holes 75 are formed arranged vertically such that each vent hole 75 corresponds to each of a plurality of substrates 1 held in the container main unit 66.

As shown in FIG. 16B, the lid 65 is configured so as to open the entrance 72 such that substrate loading/unloading openings 76, which is formed in a slit shape extending horizontally over substantially the same length as the longitudinal width of the entrance 72, are formed at the positions corresponding to a plurality of substrates 1 held in the container main unit 66, and also that the access to the adjacent substrate loading/unloading openings 76 is prevented, in an open state in which loading and unloading of the substrate 1 is allowed.

Further description is provided for the lid 65. As shown in FIG. 16, the lid 65 is formed by vertically arranging a plurality of lid forming members 77 having substantially the same longitudinal width as the entrance 72, and is configured so as to open the entrance 72 such that the bent holes 75 are formed between the adjacent lid forming members 77 in a closed state, and also that the substrate loading/unloading openings 76 are formed between the adjacent lid forming members 77 in an open state, which is achieved by rotating the lid forming members 77 around the axis core disposed along the longitudinal width direction of the entrance 72.

Each of a plurality of the lid forming members 77 is constituted by a plate-like member formed in a hollow thin plate shape when viewed from the side, and supported by a lid frame unit 78 at the center portion thereof so as to be freely rotating around the horizontal axis core. The lid 65, as shown in FIG. 16A, becomes a closed state in which a comparatively small opening formed between adjacent lid forming members 77 serves as the vent hole 75, as a result of rotating a plurality of lid forming members 77 around the horizontal axis core so as to be in a position along the vertical direction. Also, the lid 65 becomes, as shown FIG. 16B, an open state in which a comparatively large opening formed between adjacent lid forming members 77 serves as the substrate loading/unloading opening 76, as a result of rotating a plurality of lid forming members 77 around the horizontal axis core so as to be in a position along the front-and-rear direction.

That is, as shown in FIGS. 16A and 17A, when the lid 65 is in a closed state, the vent holes 75 are open between a plurality of lid forming members 77, and therefore clean air can be passed with the fan filter unit 64 from the opening on the other end side of the container 2 toward the entrance 72 to be discharged from the vent holes 75 in the entrance 72. Since the vent holes 75 are formed as small openings with a plurality of lid forming members 77 in a position along the vertical direction (direction that intersects the airflow direction), the speed of clean air discharged from the vent holes 75 is fast, and thus it is possible to prevent entry of outside air into the container 2 from the entrance 72 of the container 2.

As shown in FIGS. 16B and 17B, when the lid 65 is in an open state, the substrate loading/unloading openings 76, which is larger than the vent hole 75, are open between a plurality of lid forming members 77, and therefore the substrate 1 can be loaded and unloaded through the substrate loading/unloading opening 76. The speed of clean air discharged from the substrate loading/unloading opening 76 is fast, although not as fast as that in a closed state, as a result of the airflow path being narrowed due to a plurality of lid forming members 77 in a position along the front-and-rear direction (airflow direction), and thus it is possible to prevent entry of outside air into the container 2 from the entrance 72 of the container 2.

Also, between the adjacent lid forming members 77, the vent hole 75 is formed in a closed state and the substrate loading/unloading opening 76 is formed in an open state, as described above. A plurality of lid forming member 77 do not contact each other in open and closed states of the lid 65, or while the lid 65 is switched into these states. Therefore, no dust is caused by the lid forming members 77 contacting each other, and occurrence of dust from the lid 65 can be prevented.

The lid 65 is biased so as to return to a closed state. A connecting rod 80 as an operation section that puts the lid 65 in an open state due to upward motion thereof is provided extending downward from the bottom face portion of the container main unit 66.

Further description is provided below. As shown in FIG. 16A, a base end portion of a link member 79 is connected to each of the lid forming members 77 in a position along the vertical direction, in a state in which the link member 79 extends downward behind the lid forming member 77, such that the link member 79 and the lid forming member 77 can rotate in an integrated manner, and a free end portion of each link member 79 is connected to the connecting rod 80 that extends vertically so as to be capable of freely rotating. As a result of moving the connecting rod 80 upward in a closed state in which the lid forming members 77 are in a position along the vertical direction, an open state is achieved in which the lid forming members 77 are in a position along the front-and-rear direction. Also, by moving the connecting rod 80 downward in an open state in which the lid forming members 77 are in a position along the front-and-rear direction, a closed state is achieved in which the lid forming members 77 are in a position along the vertical direction.

The connecting rod 80 is biased downward by its own weight. The lid 65 is in a closed state when the connecting rod 80 protrudes downward from the bottom face portion of the container main unit 66. In this state, when the container 2 is mounted on the substrate loading/unloading section 6, a lid projection section 81 provided in the mount and support section 32 of the substrate loading/unloading section 6 pushes the connecting rod 80 upward, the lid forming members 77 are rotated via the link members 79 and put in a position along the front-and-rear direction, thereby putting the lid 65 in an open state. It should be noted that by lifting the container 2 from the substrate loading/unloading section 6, the connecting rod 80 is pushed downward by its own weight. Then, the lid forming members 77 are rotated via the link members 79 and put in a position along the vertical direction, thereby putting the lid 65 in a closed state. Downward motion of the connecting rod 80 is restricted by a restricting member (not shown) such that the downward motion stops at a state in which a lower end portion of the connecting rod 80 protrudes downward from the bottom face portion of the container main unit 66.

The portion that pushes the connecting rod 80 upward, such as the lid projection section 81 of the substrate loading/unloading section 6, is not provided in the storage sections 4 other than those serving as the substrate loading/unloading section 6, or the container transfer device 8 such as the stacker crane 10, so that the connecting rod 80 is pushed upward only when the container 2 is positioned in the substrate loading/unloading section 6. In this manner, the lid 65 of the container 2 maintains a closed state when the container 2 is stored in the storage section 4 other than those serving as the substrate loading/unloading section 6, or is transferred by the stacker crane 10 or the like.

That is, in the Substrate processing facility, when the container 2 is stored in the storage shelf 5, or transferred by the container transfer device 8, purity of the substrate 1 is maintained by performing ventilation with the fan filter units 64 with the lid 65 of the container 2 in a closed state. When the substrate 1 is transferred by the substrate transfer device 7 in the substrate loading/unloading section 6, purity of the substrate transfer area 24 is maintained by the fan filter units 64 performing ventilation with the lid 65 of the container 2 in an open state, and also with the clean air ventilation means for transfer area 25. In this manner, the substrate processing method capable of maintaining purity of the substrate 1 is provided.

Then, the container 2 includes a controller 109 that controls operations of three fan filter units 64 in order to increase the ventilation flow rate thereof when the lid 65 is in an open state.

Figure 18:
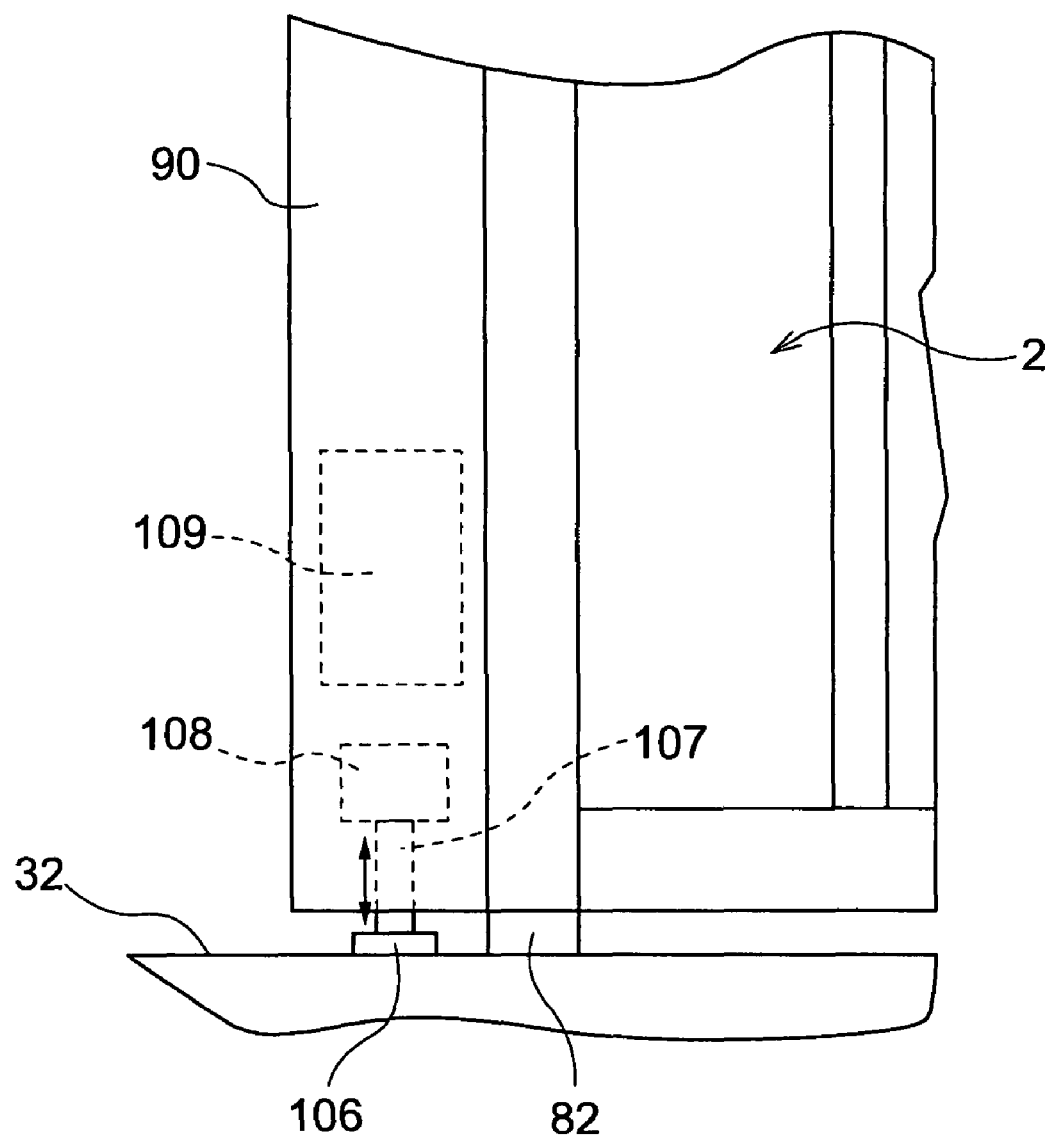
FIG. 18 is a side view illustrating a controller of the fan filter unit.

That is, as shown in FIGS. 11 and 18, the FFR frame unit 90 includes a detection piece 107 capable of ascending/descending motion, which ascends as a result of being pushed upward by an FFU projection section 106 provided in the mount and support section 32 of the substrate loading/unloading section 6 when the container 2 is mounted on the substrate loading/unloading section 6, and descends by its own weight when the container 2 is lifted up from the substrate loading/unloading section 6, a detection switch 108 including a limit switch that detects the ascending/descending motion of the detection piece 107 and sends the detected information to the controller 109, and the controller 109 that controls operations of the fan filter units 64 based on the detected information from the detection switch 108. The controller 109 controls operations of the fan filter units 64 based on the detected information from the detection switch 108, so as to increase the ventilation flow rate of the fan filter units 64 when the detection piece 107 is in an ascended state, and decrease the ventilation flow rate of the fan filter units 64 when the detection piece 107 is in a descended state.

The FFU projection section 106 is not provided in the storage sections 4 other than those serving as the substrate loading/unloading section 6, or the container transfer device 8 such as the stacker crane 10, as the lid projection section 81.

Accordingly, the ventilation flow rate of the fan filter units 64 increases when the container 2 is positioned in the substrate loading/unloading section 6 and the lid 65 is in an open state, and the ventilation flow rate of the fan filter units 64 decreases when the container 2 is not positioned in the substrate loading/unloading section 6 and the lid 65 is in a closed state.

It is preferable to prevent the substrate 1 in the container 2 from being soiled by dust caused by the lid 65 when the lid 65 is switched to an open state or a closed state, by increasing the ventilation flow rate of the fan filter units 64 at a time point before the lid 65 is switched to an open state, and decreasing the ventilation flow rate at a time point after the lid 65 is switched to a closed state. Such a relation between the switching of the lid 65 to an open state and a closed state, and increase and decrease in the ventilation flow rate of the fan filter units 64 can be achieved by adjusting the height of the lid projection section 81 and the FFU projection section 106.

As shown in FIG. 11, the fan filter units 64 and the lid 65 are detachably attached to the container main unit 66. The fan filter units 64 and the lid 65 can be removed from the container 2 such that the container 2 can be washed easily.

Figure 14:
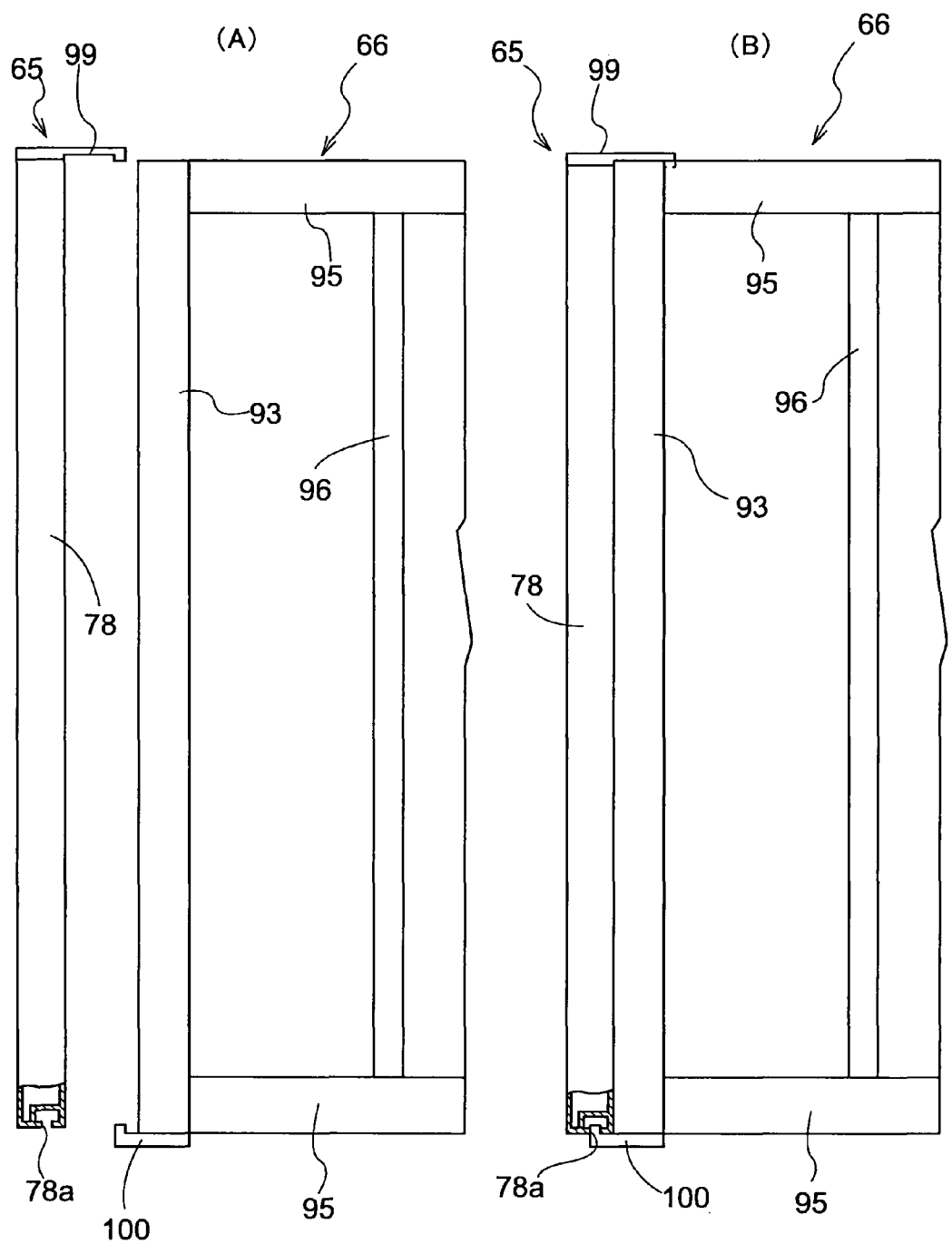
FIG. 14 is a side view illustrating attaching/detaching of a lid.

Specifically, as shown in FIG. 14, at the upper end portion of the lid frame unit 78 is provided a lid engagement member 99 that engages with an upper portion of the one end side rectangular frame 93 of the container main unit 66 from above. At a lower end portion of the one end side rectangular frame 93, a lid engagement support plate 100 is provided that engages with an engaged groove 78a that is formed at the lower end portion of the lid frame unit 78 so as to mount and support the lid frame unit 78. The lid 65 can be attached and detached with respect to the container main unit 66 by engaging and disengaging the lid engagement member 99 with an upper portion of the one end side rectangular frame 93, and engaging and disengaging the lid engagement support plate 100 with the engaged groove 78a of the lid frame unit 78.

Figure 15:
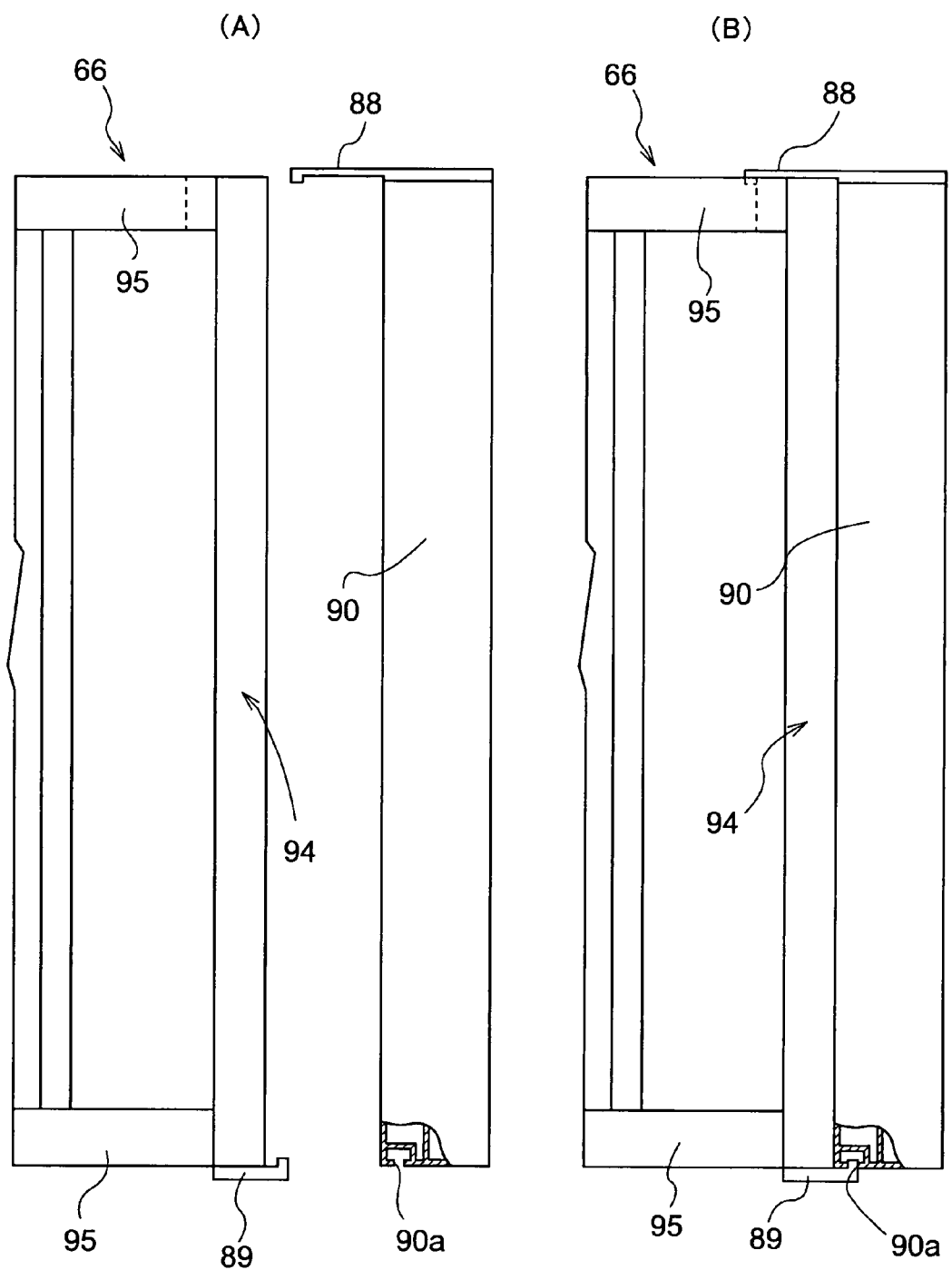
FIG. 15 is a side view illustrating attaching/detaching of a fan filter unit.

In addition, as shown in FIG. 15, at an upper end portion of the FFU frame unit 90, an FFU engagement member 88 is provided that engages with an upper portion of the other end side rectangular frame 94 of the container main unit 66 from above. At a lower end portion of the other end side rectangular frame 94, an FFU engagement support plate 89 is provided that engages with an engaged groove 90a that is formed at a lower end portion of the FFU frame unit 90 so as to support and mount the FFU frame unit 90. The fan filter units 64 can be attached and detached with respect to the container main unit 66 along with the power supply section 70b and the battery 71, by engaging and disengaging the FFU engagement member 88 with an upper portion of the other end side rectangular frame 94, and engaging and disengaging the FFU engagement support plate 89 with the engaged groove 90a of the FFU frame unit 90.

As shown FIG. 2, part of a plurality of storage sections 4 at the lowest level provided in the storage shelf 5 serve as the loading/unloading section 9 for cart where the container 2 can be loaded and unloaded with a cart 85 through the rear face side of the storage shelf 5. After the container 2 is unloaded through the loading/unloading section 9 for cart using the cart 85, the fan filter units 64 and the lid 65 can be removed from the container 2, so that the container 2 can be washed using a container washing device 86. At the rear face side of the loading/unloading section 9 for cart, a shutter 84 that closes the rear face side of the loading/unloading section 9 is provided. The controller H controls operations of the stacker crane 10 such that the stacker crane 10 does not transfer the container 2 to the loading/unloading section 9 for cart while the shutter 84 is open.

Other Embodiments (1) In the above embodiment, while the lid 65 that opens and closes the entrance 72 of the container 2 is provided at the entrance portion of the container 2, the lid 65 that opens and closes the entrance 72 of the container 2 may not be provided at the entrance portion of the container 2.

(2) In the above embodiment, the container 2 is stored in the storage section 4, in both of a pair of the storage shelves 5, in a state in which the side of the container 2 on which the fan filter units 64 are provided is positioned on the side toward the traveling space, and the side of the container 2 toward the entrance is positioned on the side away from the traveling space. However, the container 2 may be stored in the storage section 4 in a state in which the side of the container 2 on which the fan filter units 64 are provided is positioned on side toward the traveling space, and the side of the container 2 toward the entrance is positioned on the side away from the traveling space in one of a pair of the storage shelves 5, and the container 2 may be stored in the storage section 4 in a state in which the side of the container 2 on which the fan filter units 64 are provided is positioned on the side away from the traveling space and the side of the container 2 toward the entrance is positioned on the side toward traveling space in the other one of a pair of the storage shelves 5.

Furthermore, in the above embodiment, although a pair of storage shelves 5 is arranged facing each other, only one storage shelf 5 may be provided.

(3) In the above embodiment, the clean air ventilation means 23 is provided and the space where the substrate storage facility A is provided is created as a down-flow clean space, where clean air is passed from the ceiling portion to the floor portion. However, the clean air ventilation means 23 may not be provided, and the space where the substrate storage facility A is provided may not be a clean space.

(4) In the above embodiment, the substrate storage facility A is provided in the clean space so as to be open to the surrounding area thereof. However, the substrate storage facility A may be covered with a booth, and the storage shelves 5 and the container transfer device 8 may be provided in the booth.

(5) In the above embodiment, when the substrate 1 is transferred by the substrate transfer device 7 in the substrate loading/unloading section 6, the ventilation flow rate of the fan filter units 64 of the container 2 is increased. However, it is possible that the ventilation flow rate of the fan filter units 64 is not increased even when the substrate 1 is transferred by the substrate transfer device 7 in the substrate loading/unloading section 6.

That is, the ventilation flow rate of the fan filter units 64 of the container 2 may be kept constant when the container 2 is stored in the storage shelf 5, when the container 2 is transferred by the container transfer device 8, and when the substrate 1 is transferred by the substrate transfer device 7 in the substrate loading/unloading section 6.

Also, the ventilation flow rates of the fan filter units 64 of the container 2 for when the container 2 is stored in the storage shelf 5, when the container 2 is transferred by the container transfer device 8, and when the substrate is transferred by the substrate transfer device 7 in the substrate loading/unloading section 6 may be varied. For example, the ventilation flow rate of the fan filter units 64 of the container 2 when the container 2 is transferred by the container transfer device 8 may be set larger than that when the container 2 is stored in the storage shelf 5, and the ventilation flow rate when the substrate is transferred by the substrate transfer device 7 in the substrate loading/unloading section 6 may be set larger than that when the container 2 is transferred by the container transfer device 8. Specifically, the ventilation flow rate of the fan filter units 64 of the container 2 may be increased even when the container 2 is transferred by the container transfer device 8. The ventilation flow rate when the container 2 is transferred by the container transfer device 8 may be equal to or larger than that when the substrate is transferred by the substrate transfer device 7 in the substrate loading/unloading section 6.

(6) In the above embodiment, although the storage shelves 5 are disposed on the floor portion (grating floor 14) of the clean space 13, the storage shelves 5 may be disposed on the bottom portion of the air intake chamber 16 located below the floor space.

(7) In the above embodiment, although the ceiling portion of the clean space 13 is formed by air filters, the ceiling portion of the clean space 13 may be formed by fan filter units for the ceiling portion.

(8) In the above embodiment, both side portions of the container main unit 66 have a double structure including the exterior surface members 97 and the interior surface members 98, it is possible that both side portions have a single structure including only interior surface members, as the top and bottom portions.

(9) In the above embodiment, the base end portion of the link member 79 is connected to each of the lid forming members 77 in the position along the vertical direction, in a state in which the link member 79 extends downward behind the lid forming member 77, such that the link member 79 and the lid forming member 77 can rotate in an integrated manner, and accordingly the connecting rod 80 to which a free end portion of each link member 79 is connected so as to be capable of freely rotating is located on the rear side (side of the container main unit) from the rotation axis core of the lid forming members 77. However, it is also possible that the base end portion of the link member 79 is connected to each of the lid forming members 77 in a position along the vertical direction, in a state in which the link member 79 extends downward in front of the lid forming member 77, such that the link member 79 and the lid forming member 77 can rotate in an integrated manner, and accordingly the connecting rod 80 to which a free end portion of each link member 79 is connected so as to be capable of freely rotating is located on the front side (the opposite side to the container main unit) from the rotation axis core of the lid forming member 77.

(10) In the above embodiment, the connecting rod 80 is operated as a result of moving the container 2 vertically in the substrate loading/unloading section 6 with the container transfer device 8, thereby switching the lid 65 between an open state and a closed state. However, it is also possible that a driving means such as an electric motor is provided in the lid 65 for operating the connecting rod 80, and the lid 65 is switched between an open state and a closed state as a result of operating the connecting rod 80 with the driving means.

(11) In the above embodiment, a plurality of the lid forming members 77 are configured such that all of them rotate in an integrated manner. However, it is also possible that when the lid 65 is in an open state, some of the lid forming members 77 are put in a position along the frond-and-rear direction and other lid forming members 77 are put in a position along the vertical direction, so that some lid forming members 77 are kept in a position along the vertical direction even in an open state in order to increase the speed of discharged clean air. For this purpose, a plurality of lid forming member 77 may be configured so as to be operated to rotate on an individual basis, or on a group basis of some lid forming members.

Specifically, for example, it is possible that when a plurality of lid forming members 77 are operated to rotate on a group basis of some lid forming members, the following configuration is possible. An upper half of a plurality of the lid forming members 77 are connected at one end portions thereof in the longitudinal width direction to the connecting rod 80 on that one end side via the link members 79, and a lower half of a plurality of the lid forming members 77 are connected at the other end portions thereof in the longitudinal width direction to the connecting rod 80 on that other end side via the link members 79, and consequently, the upper half of the lid forming members 77 are put in a position along the front-and-rear direction through operations of the connecting rod 80 on the one end side so as to load and unload the substrate 1 in an upper half of the container 2, and the lower half of the lid forming members 77 are put in a position along the front-and-rear direction through operations of the connecting rod 80 on the other end side so as to load and unload the substrate 1 in a lower half of the container 2.

(12) In the above embodiment, the ventilation flow rate of the fan filter unit 64 is varied based on the ascending/descending motion of the detection piece 107 by the FFU projection section 106. However, the ventilation flow rate of the fan filter unit 64 may be varied based on the ascending/descending motion of the connecting rod 80 by the lid projection section 81.

Specifically, it is possible that a detection means that detects the ascending/descending motion of the connecting rod 80 and transmits detection signals to the controller 109 is provided to the lid frame unit 78, and the controller 109 controls operations of the fan filter units 64 based on the detection information from the detection means so as to increase the ventilation flow rate of the fan filter units 64 when the connecting rod 80 is in an ascended state and the lid 65 is open, and decrease the ventilation flow rate of the fan filter units 64 when the connecting rod 80 is in a descended state and the lid 65 is closed.

It should be noted that transmission of the detected information from the detection means to the controller 109 may be performed by wire, by providing in the container main unit 66 a cable connected to the lid frame unit 78 and the FFU frame unit 90 in a separable manner, or alternatively, may be performed wirelessly by providing a transmitter in the lid frame unit 78, and a receiver in the FFU frame unit 90.

What is claimed is:

1. Substrate storage facility comprising:
   a container that holds a plurality of the substrates with the substrates lined up vertically with space therebetween and that is tubular having a generally quadrangular cross-section, the container including a first opening provided on one end side and a second opening provided on the other end side spaced apart in a horizontal direction from the first opening, the first opening serving as an entrance for loading and unloading the substrates;
   a lid provided in an entrance portion of the container for opening and closing the entrance of the container, the lid comprising a plurality of lid forming members that form a plurality of vent holes when the lid forming member are in a closed state;
   a fan filter unit, provided in an area of the second opening of the container, that causes movement of air from the second opening toward the first opening;
   a pair of storage shelves arranged to face each other, each of the storage shelves including a plurality of storage sections, each of which is adapted to store the containers;
   a loading/unloading section for the container;
   a container transfer device that is configured to travel in a shelf longitudinal width direction in a traveling space in front of each of and between the pair of storage shelves and to transfers the container between the loading/unloading section and the storage sections; and
   a controller that controls an operation of the container transfer device such that the container is stored in the storage section with a side of the container where the fan filter unit is provided is positioned toward the traveling space, and the entrance side of the container being positioned away from the traveling space.

2. The substrate storage facility of claim 1,
   wherein
   the container transfer device comprises a revolving means that revolves a support container;
   the controller controls an operation of the container transfer device such that the container is stored in the storage section in either of the two storage shelves, with the side of the container where the fan filter unit is provided is positioned toward the traveling space and the entrance side of the container is positioned away from the traveling space.

3. Substrate processing facility in which the substrate storage facility of claim 1 is provided,
   wherein the substrate storage facility is provided so as to be open to a surrounding area in a clean space where clean air is caused to move from a ceiling portion to a floor portion.

4. The substrate storage facility of claim 1,
   wherein the fan filter unit comprises a fan, a filter and a power receiving section supported by a frame unit.

5. The substrate storage facility of claim 4,
   wherein the fan filter unit comprises a battery that supplies power to the fan.

6. The substrate storage facility of claim 1,
   wherein the loading/unloading section forms a part of the storage shelf.

7. A method for operating substrate storage facility, the substrate storage facility comprising:
   providing the substrate storage facility comprising:
   a container that holds a plurality of the substrates with the substrates lined up vertically with space therebetween, and that is tubular having a generally quadrangular cross-section, the container including a first opening provided on one end side and a second opening provided on the other end side spaced apart in the horizontal direction from the first opening, the first opening serving as an entrance for loading and unloading the substrates;
   a lid provided in an entrance portion of the container for opening and closing the entrance of the container, the lid comprising a plurality of lid forming members that form a plurality of vent holes when the lid forming member are in a closed state;
   a fan filter unit, provided in an area of the second opening of the container, that causes movement of air from the second opening toward the first opening;
   a pair of storage shelves arranged to face each other, each of the storage shelves including a plurality of storage sections, each of which is adapted to store the containers;
   a loading/unloading section for the container;
   a container transfer device that is configured to travel in a shelf longitudinal width direction in a traveling space in front of and between the pair of storage shelves face each other and to transfers the container between the loading/unloading section and the storage sections; and
   a controller that controls an operation of the container transfer device;
   ventilating the container with the fan filter unit to move air from the second opening toward the first opening and to allow air to be discharged from the container through the plurality of vent holes with the lid in the closed states, at least when the container is stored in the storage shelf; and
   storing the container in the storage section with a side of the container where the fan filter unit is provided is positioned toward the traveling space, and the entrance side of the container is positioned away from the traveling space.

8. A method for operating substrate storage facility having a container that holds a plurality of the substrates with the substrates lined up vertically with space therebetween, and that is tubular having a generally quadrangular cross-section, the container including a first opening provided on one end side and a second opening provided on the other end side spaced apart in the horizontal direction from the first opening, the first opening serving as an entrance for loading and unloading the substrates; a lid provided in an entrance portion of the container for opening and closing the entrance of the container, the lid comprising a plurality of lid forming member that form a plurality of vent holes when the lid forming member are in the closed state; a fan filter unit provided in an area of the second opening of the container; a pair of storage shelves arranged to face each other, each of the storage shelves including a plurality of storage sections, each of which is adapted to store the containers; a loading/unloading section for the container; and a container transfer device,
   the method for operating substrate storage facility comprising:
   ventilating the container with the fan filter unit to move air from the second opening toward the first opening and to allow air to be discharged from the container through the plurality of vent holes with the lid in the closed state at least when the container is stored in the storage shelf;
   causing the container transfer device to travel in a shelf longitudinal width direction in a traveling space in front of each of and between the pair of storage shelves that face each other to transfer the container between the loading/unloading and the storage section; and
   storing the container in the storage section with a side of the container where the fan filter unit is provided being positioned toward the traveling space, and the entrance side of the container being positioned away from the traveling space.

* * * * *

UNITED STATES PATENT AND TRADEMARK OFFICE
CERTIFICATE OF CORRECTION

| | |
|---|---|
| PATENT NO. | : 8,118,530 B2 |
| APPLICATION NO. | : 11/900630 |
| DATED | : February 21, 2012 |
| INVENTOR(S) | : Yoshiteru Ikehata |

It is certified that error appears in the above-identified patent and that said Letters Patent is hereby corrected as shown below:

(1) Face of the Patent, Item 54 Column 1, Line 4, after "STORAGE" insert -- FACILITY --

(2) Column 1, Line 4, after "STORAGE" insert -- FACILITY --

(3) Column 16, Line 21, Claim 1, delete "member" and insert -- members --

(4) Column 16, Line 34, Claim 1, delete "transfers" and insert -- transfer --

(5) Column 16, Line 39, Claim 1, after "provided" delete "is" and insert -- being --

(6) Column 16, Line 45, Claim 2, delete "support" and insert -- supported --

(7) Column 17, Lines 1-2, Claim 7, delete "facility, the substrate storage facility comprising:" and insert -- facility comprising --

(8) Column 17, Line 17, Claim 7, delete "member" and insert -- members --

(9) Column 17, Line 25, Claim 7, delete "containers;" and insert -- container; --

(10) Column 17, Line 29, Claim 7, after "front of" insert -- each of --

(11) Column 17, Line 30, Claim 7, after "shelves" insert -- that --

(12) Column 17, Line 30, Claim 7, delete "transfers" and insert -- transfer --

(13) Column 17, Line 38, Claim 7, delete "states," and insert -- state, --

(14) Column 18, Line 2, Claim 7, after "provided" delete "is" and insert -- being --

Signed and Sealed this
Fifteenth Day of May, 2012

David J. Kappos
*Director of the United States Patent and Trademark Office*

CERTIFICATE OF CORRECTION (continued)
U.S. Pat. No. 8,118,530 B2

(15) Column 18, Lines 16-17, Claim 8, delete "member" and insert -- members --

(16) Column 18, Line 18, Claim 8, delete "member" and insert -- members --

(17) Column 18, Line 35, Claim 8, delete "section;" and insert -- sections; --